United States Patent
Yin et al.

(10) Patent No.: US 9,496,039 B2
(45) Date of Patent: Nov. 15, 2016

(54) STORAGE DEVICE AND METHOD FOR PERFORMING INTERRUPTION CONTROL THEREOF

(71) Applicant: MEMBLAZE TECHNOLOGY (BEIJING) CO., LTD., Beijing (CN)

(72) Inventors: Xuebing Yin, Beijing (CN); Yilei Wang, Beijing (CN)

(73) Assignee: MEMBLAZE TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 14/408,535

(22) PCT Filed: Jun. 15, 2013

(86) PCT No.: PCT/CN2013/077285
§ 371 (c)(1),
(2) Date: Dec. 16, 2014

(87) PCT Pub. No.: WO2013/185637
PCT Pub. Date: Dec. 19, 2013

(65) Prior Publication Data
US 2015/0155044 A1    Jun. 4, 2015

(30) Foreign Application Priority Data

Jun. 16, 2012 (CN) .......................... 2012 1 0204083

(51) Int. Cl.
*G11C 16/10* (2006.01)
*G06F 3/06* (2006.01)
*G06F 13/28* (2006.01)

(52) U.S. Cl.
CPC .............. *G11C 16/10* (2013.01); *G06F 3/0611* (2013.01); *G06F 3/0656* (2013.01); *G06F 3/0679* (2013.01); *G06F 13/28* (2013.01); *G11C 2207/2245* (2013.01)

(58) Field of Classification Search
CPC .............. G11C 16/10; G11C 16/3454; G11C 16/3459
USPC ....................................... 365/185.24; 711/113
See application file for complete search history.

(56) References Cited

U.S. PATENT DOCUMENTS 5,878,217 A * 3/1999 Cherukuri ............. G06F 13/387
                                                        709/212
8,031,551 B2    10/2011 Wilson
(Continued)

FOREIGN PATENT DOCUMENTS

| CN | 101221544 A | 7/2008 |
| CN | 101339802 A | 1/2009 |
| CN | 101710252 A | 5/2010 |
| CN | 201788502 U | 4/2011 |

(Continued)

OTHER PUBLICATIONS

International Search Report issued in PCT/CN2013/077285, mailed Sep. 19, 2013 (5 pages).
(Continued)

*Primary Examiner* — Alexander Sofocleous
*Assistant Examiner* — Alfredo Bermudez Lozada
(74) *Attorney, Agent, or Firm* — Osha Liang LLP

(57) ABSTRACT

A storage device includes a flash memory and a buffer memory. A method of controlling interrupts includes: receiving data to be written to the storage device from an information processing device; writing the received data to be written to the storage device to the buffer memory; fetching the data in the buffer memory and writing the data to the flash memory; in which, after writing the received data to be written to the storage device to the buffer memory, if the amount of data in the buffer memory is less than the predetermined threshold, then sending a message indicating the completion of the write operation to the information processing device.

6 Claims, 20 Drawing Sheets

(56) References Cited

U.S. PATENT DOCUMENTS

2009/0049222 A1* 2/2009 Lee ............... G06F 13/1684
                                           710/300
2009/0216945 A1* 8/2009 Shimada ............ G06F 13/28
                                           711/113
2012/0093170 A1* 4/2012 Cantu ............. H04L 49/9057
                                           370/415
2013/0003751 A1* 1/2013 Huse ............... H04L 47/27
                                           370/412

FOREIGN PATENT DOCUMENTS

| CN | 102043689 A | 5/2011 |
|---|---|---|
| CN | 102799392 A | 11/2012 |

OTHER PUBLICATIONS

Written Opinion issued in PCT/CN2013/077285, mailed Sep. 19, 2013 (9 pages).

* cited by examiner

301

Receive write command including addresses used for flash memory, for buffer memory and data from the host

302

Based on the address used for the buffer memory, write data to the buffer memory

303

Based on the address used for the flash memory, write data to the flash memory

| 401 | 402 | 403 |
| User Application | User Application | User Application |

Storage Device Driver     406
405          Buffer Control Block
       411  412                          41n Operating System
404

Fig. 4

501
Receive the write request, which includes data and address used for the storage device

502
Allocate free buffer memory for the write request

503
Send a write command to the storage device, wherein the write command includes the data and addresses used for the storage device and the buffer memory

504
Receive an interrupt request, indicating the completion of the write command, from the storage device

505
Release the buffer memory occupied by the write request

Fig. 5

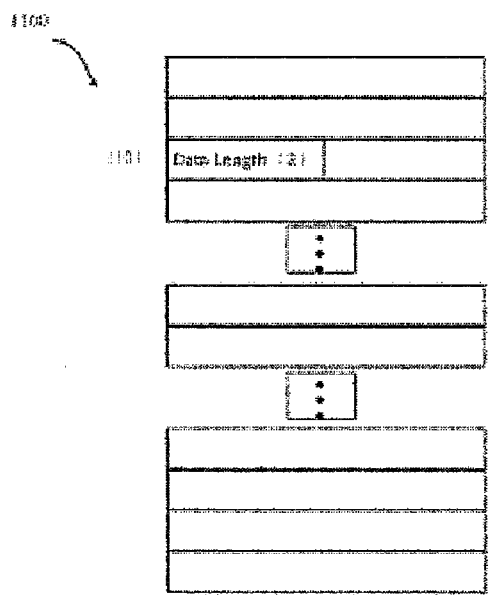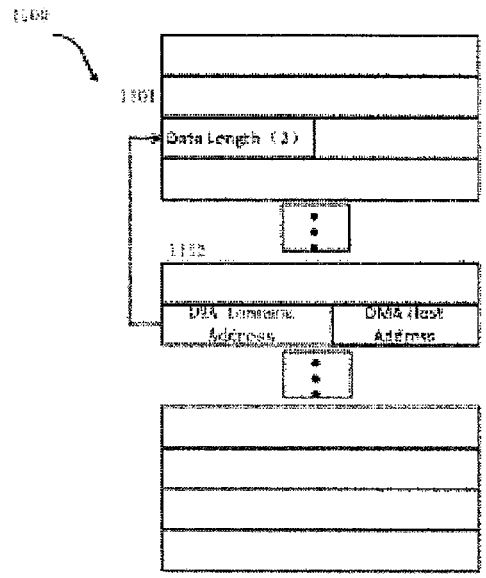
Fig. 11A Fig. 11B
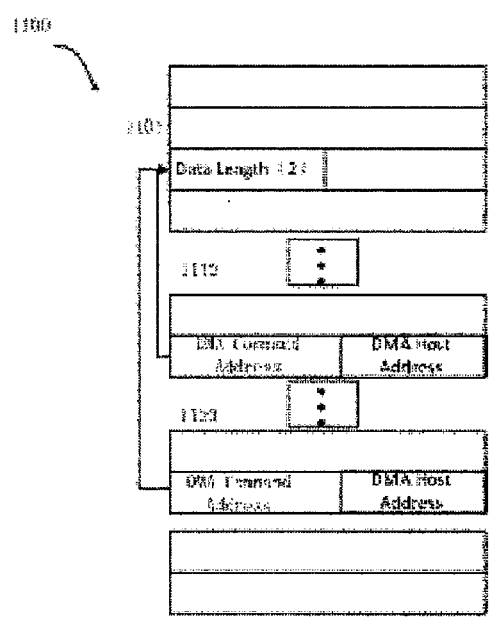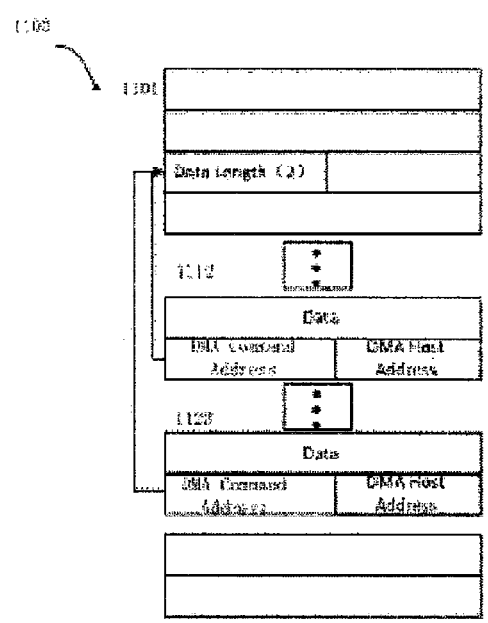
Fig. 11C Fig. 11D

STORAGE DEVICE AND METHOD FOR PERFORMING INTERRUPTION CONTROL THEREOF

CROSS REFERENCE TO RELATED APPLICATION

This application is a national stage application based on PCT/CN2013/077285, filed on Jun. 15, 2013, which claims priority to Chinese Patent Application No. 201210204083.7, filed on Jun. 16, 2012. This application claims the benefit and priority of these prior applications and incorporates their disclosures by reference in their entireties.

TECHNICAL FIELD

The invention involves Solid Storage Device (SSD), more specifically, the invention relates to interrupts sent from the storage device to a host.

BACKGROUND

Similar to the mechanical hard disk, solid storage device (SSD) is a large capacity, non-volatile storage device used for computer system. Solid storage device in general uses Flash as storage medium. In Chinese patent documents CN102043689A the solid storage device as shown in FIG. 17 is disclosed. FIG. 13 shows the function block diagram of the general present solid storage devices, including the host system 1701 and solid storage device 1702. Thereinto, the solid storage device 1702 includes the interface module 1703, solid storage processor 1304, as well as Flash array 1706 consisting of Flash chip 1705 as a unit. Among them, the interface module 1303 is mainly used for implementing the interface protocol consistent with the host system, such as SATA (Serial Advanced Technology Attachment), USB (Universal Serial Bus), PCIE (Peripheral Component Interconnect Express), SCSI (Small Computer System Interface), IDE (Integrated Drive Electronics) etc. Through the interface module 1703, the solid storage device shows the host system a standard storage device with certain logic space. Solid storage processor 1704 is the control core of the whole storage device, which is mainly in charge of the control signals and data transmission between the interface module 1703 and flash array 1706, Flash management, conversion or mapping from the host logical address to Flash physical address, wear-leveling (the logical addresses are mapped to different physical addresses so as to prevent a single Flash chip from being concentratedly operated and disabled early), bad block management and so on. Solid storage processor 1704 can be implemented by a variety of software, hardware, firmware or their combination. 1705 is the individual Flash chip, and Flash array 1706 is consisting of a plurality of Flash chip 1705.

In order to improve the reading and writing speed of the solid storage device, random access memories such as DRAM or SRAM or other types of high speed reading/writing memories can be set up in the solid storage device, serving as cache memory when reading and writing data from the Flash. In the process of the storage device access, as an example, the computer sends SCSI (small computer system interface) command to the storage device, and the storage device receives and processes the SCSI command, executing corresponding storage medium reading and writing process according to the operation that the SCSI command indicates. In this process, the SCSI command does not directly operate the high speed buffer memory. That means, the cache memory is "transparent" to the computer or user. There are also some storage devices providing cache memory "flushing" mechanism, which means the computer or user can use a predetermined command to force the storage device to write the data in the cache memory to the non-volatile storage medium (for example, a disk or flash memory).

However, allocation and management of the cache memory will become the burden of the controller on the solid storage device. And when the cache memory is fully occupied, if the solid storage device receives new access request from the host system, it also needs to perform replace operations on the cache memory. Thus not only the complexity of the controller is increased, but also the host will experience bump on read/write performance over.

DMA (Direct Memory Access) transmission can also be executed between the host and the device. Method and device for executing DMA transmission is disclosed in the Chinese patent documents CN101221544A. A typical procedure of DMA transmission is Scatter/Gather operation. In the scatter/gather operation, a plurality of data blocks to be transmitted is stored at multiple discontinuous address location in the system (host) memory. The processor does not need to provide programming operation to the DMA controller for each data block being moved from a source to a destination, but just sets up descriptor table or the descriptor linked table in the system memory. Descriptor table or the descriptor linked table comprises a set of descriptors, each of which describes the data block's moving direction, source address, destination address and optional number of bytes transmitted. In the case not including number of bytes transmitted in a descriptor, the agreed length data can be transmitted through the DMA mode.

Chinese Patent CN101710252B discloses a technical solution of avoiding data loss in the buffer memory storage device during unexpected power outage. Thereinto, a standby power is provided in the storage device, so when the unexpected power outage occurs, the standby power will provide temporary electricity to the storage device for transferring data in the buffer memory (cache) to the flash memory. In American Patent document U.S. Pat. No. 8,031,551 B2 discloses the technical solution of using a capacitor as standby power for the storage device, and the performance of the capacitor can be detected at run time, upon which when the capacitance is too low, the capacitor will be charged.

SUMMARY OF THE INVENTION

Thus, offloading the burden of work on the storage device controller is beneficial. By transferring the maintenance work related to the buffer memory of the storage device to the host, not only the storage device controller is offloaded, but also the host is provided the ability to control the storage device more flexibly.

However, the semiconductor technology develops much faster than that of the capacitor as the standby power. The power provided by the capacitor as the standby power limits the size of the buffer memory that can be used in the storage device.

According to the first embodiment of the invention, a method of controlling interrupts in the storage device is provided, wherein the storage device includes a flash memory and a buffer memory. The method includes: receiving data to be written to the storage device from the information processing device; writing the received data to be written to the storage device to the buffer memory;

fetching the data in the buffer memory and writing the data to the flash memory; wherein, after writing the received data to be written to the storage device to the buffer memory, if the amount of data in the buffer memory is less than the predetermined threshold, then sending a message indicating the completion of the write operation to the information processing device.

In the first embodiment according to the invention, wherein, after writing the received data to be written to the buffer memory, if the amount of data in the buffer memory is greater than or equal to the predetermined threshold, then the message indicating the completion of the write operation will not be sent to the information processing device.

In the first embodiment according to the invention, wherein the predetermined threshold is corresponding to the amount of data that can be reliably fetched from the buffer memory and written to the flash memory using the standby power.

In the first embodiment according to the invention, it also includes the information processing device accessing or setting the predetermined threshold, or measuring the electrical characteristics of the standby power, and modifying the predetermined threshold based on the measurement results.

According to the second embodiment of the invention, a method of controlling interrupts in the storage device is provided, wherein the storage device includes a first flash memory, a second flash memory, and a buffer memory. The method includes: receiving data to be written to the storage device from the information processing device; writing the received data to be written to the storage device to the buffer memory; fetching the data in the buffer memory and writing the data to the first flash memory or the second flash memory; wherein, after writing the received data to be written to the storage device to the buffer memory, if the amount of data in the buffer memory to be written to the first flash memory is less than the predetermined threshold, and the amount of data in the buffer memory to be written to the second flash memory is less than the predetermined threshold, then sending a message indicating the completion of the write operation to the information processing device.

In the second embodiment according to the invention, wherein, after writing the received data to be written to the buffer memory, if the amount of data in the buffer memory to be written to the first flash memory is greater than or equal to the predetermined threshold, or the amount of data in the buffer memory to be written to the second flash memory is greater than or equal to the predetermined threshold, then the message indicating the completion of the write operation will not be sent to the information processing device.

In the second embodiment according to the invention, wherein the predetermined threshold is corresponding to the amount of data that can be reliably fetched from the buffer memory and written to the first and second flash memory using the standby power.

According to the third embodiment of the invention, a method of controlling interrupts in the storage device is provided, wherein the storage device includes a flash memory and a buffer memory. The method includes: receiving write requests from the information processing device; based on the write requests, writing data to the buffer memory, and incrementing the counter; fetching the data in the buffer memory and writing it to the flash memory, and decrementing the counter; wherein, if the counter is less than the first predetermined threshold, then sending a message indicating the completion of the write request to the information processing device.

In the third embodiment according to the invention, if the counter is greater than or equal to the first predetermined threshold, then the host of the information processing device will send the message indicating the completion of the write requests.

In the third embodiment according to the invention, the write requests will also be cached after being received from the information processing device.

In the third embodiment according to the invention, wherein the write requests include identifiers for identifying the write requests.

In the third embodiment according to the invention, wherein, the message that indicates the completion of the write request carries the identifier.

In the third embodiment according to the invention, the identifiers will also be cached after the write requests being received from the host.

According to the fourth embodiment of the invention, a storage device is provided, including a flash memory, a buffer memory, an information processing device interface and a control circuit, wherein the control circuit also includes a counter and an interrupt controller, and the storage device and the information processing device can be communicably connected; wherein the information processing device interface will receive the write requests from the information processing device; the control circuit, based on the write requests, will write data to the buffer memory, and increment the counter; the control circuit will fetch the data in the buffer memory and write it to the flash memory, and decrement the counter; if the counter is less than the predetermined threshold, the interrupt controller will send a message indicating the completion of the write request to the information processing device.

In the fourth embodiment according to the invention, if the counter is greater than or equal to the predetermined threshold, the interrupt controller will not send the message indicating the completion of the write request to the information processing device.

In the forth embodiment according to the invention, the write requests will also be cached by the control circuit after being received from the information processing device by the information processing device interface.

According to the fifth embodiment of the invention, a storage device is provided, including a buffer memory, a flash memory, an information processing device interface and a control circuit, in which the control circuit also includes a counter and an interrupt controller, and the storage device and the information processing device can be communicably connected, wherein: the information processing device interface will receive the data to be written to the storage device from the information processing device; the control circuit will write the received data to be written to the storage device to the buffer memory; the control circuit will fetch the data in the buffer memory and write it to the flash memory; after writing the received data to be written to the storage device to the buffer memory, if the amount of data in the buffer memory is less than the predetermined threshold, then the interrupt controller will sent a message indicating the completion of the write operation to the information processing device.

In the fifth embodiment according to the invention, wherein, after writing the received data to be written to the storage device to the buffer memory, if the amount of data in the buffer memory is greater than or equal to the predetermined threshold, then the interrupt controller will not sent the message indicating the completion of the write operation to the information processing device.

In the fifth embodiment according to the invention, wherein, the control circuit will also access or set the predetermined threshold based on the commands of the information processing device, or measure the electrical characteristics of the standby power, and modify the predetermined threshold based on the measurement results.

According to the sixth embodiment of the invention, a storage device is provided. The storage device includes a buffer memory, a first flash memory, a second flash memory, an information processing device interface and a control circuit, in which the control circuit also includes a counter and an interrupt controller, and the storage device and the information processing device can be communicably connected, wherein: the information processing device interface will receive the data to be written to the storage device from the information processing device; the control circuit will write the received data to be written to the storage device to the buffer memory; the control circuit will fetch the data in the buffer memory and write it to the first flash memory and the second flash memory; after writing the received data to be written to the storage device to the buffer memory, if the amount of data in the buffer memory to be written to the first flash memory is less than the predetermined threshold, and the amount of data in the buffer memory to be written to the second flash memory is less than the predetermined threshold, then the interrupt controller will sent a message indicating the completion of the write operation to the information processing device.

In the sixth embodiment according to the invention, wherein, after writing the received data to be written to the storage device to the buffer memory, if the amount of data in the buffer memory to be written to the first flash memory is greater than or equal to the predetermined threshold, or the amount of data in the buffer memory to be written to the second flash memory is greater than or equal to the predetermined threshold, then the interrupt controller will not sent the message indicating the completion of the write operation to the information processing device.

In the seventh embodiment of the invention, a method of writing data to the storage device is provided, wherein the storage device includes a buffer memory and a flash memory, and the storage device and the information processing device can be communicably connected. The method includes: receiving the first write command from the information processing device, with the first write command including the data to be written, the addresses for the flash memory and for the buffer memory; based on the address for the buffer memory, writing the data to be written into the buffer memory; based on the addresses for the flash memory and for the buffer memory, writing the data to be written in the buffer memory into the flash memory.

In the eighth embodiment of the invention, a method for DMA transmission between the information processing device and the storage device is provided, wherein the storage device includes a buffer memory and a flash memory chip. The method includes: receiving the first IO request; distributing the first storage unit and the second storage unit for the first IO request; sending the first DMA descriptor to the storage device, wherein the first DMA descriptor including the DMA host address, the address for the flash memory chip of the storage device, and the first address for the buffer memory and the second address for the buffer memory, wherein, the first address for the buffer memory corresponding to the first storage unit, the second address for the buffer memory corresponding to the second storage unit; carrying out the DMA transmission between the storage device and the information processing device according to the first DMA descriptor; receiving the message from the storage device which indicates the completion of the first DMA descriptor; releasing the first storage unit and the second storage unit.

In the ninth embodiment of the invention, a method executed by the storage device communicating with the information processing device is provided, wherein the storage device includes a buffer memory. The method includes: receiving the first DMA descriptor command from the information processing device, wherein the first DMA descriptor command including the first address and length information for the buffer memory; obtaining the first storage unit in the buffer memory of the storage device based on the first address for the buffer memory, and storing the length information in the first storage unit; receiving the first DMA descriptor data from the information processing device, wherein the first DMA descriptor data including the second address for the buffer memory; obtaining the second storage unit in the buffer memory of the storage device based on the second address for the buffer memory, and recording the address of the first storage unit in the second storage unit; based on the first DMA descriptor data, writing the first data from the information processing device to the second storage unit by DMA transmission; based on the address of the first storage unit recorded in the second storage unit, accessing the length information in the first storage unit, to determine whether the DMA operation is completed.

DESCRIPTION OF THE DRAWINGS

When reading along with the drawings, by reference to the detailed description of embodiments showed hereinafter, the present invention, as well as the preferred mode and its further purpose and advantages will be best understood, wherein the drawings include:

FIG. 3 is a flow chart of the method of executing the write command according to the storage device in the embodiments of the present invention;

FIG. 4 is a schematic diagram of the host according to the embodiment of the invention;

FIG. 5 is a flow chart of the host executing the write operation according to the embodiment of the invention;

FIG. 11A-11F shows a variety of status of the buffer memory related to FIG. 10B, FIG. 10C;

DETAILED DESCRIPTION

Figure 1:
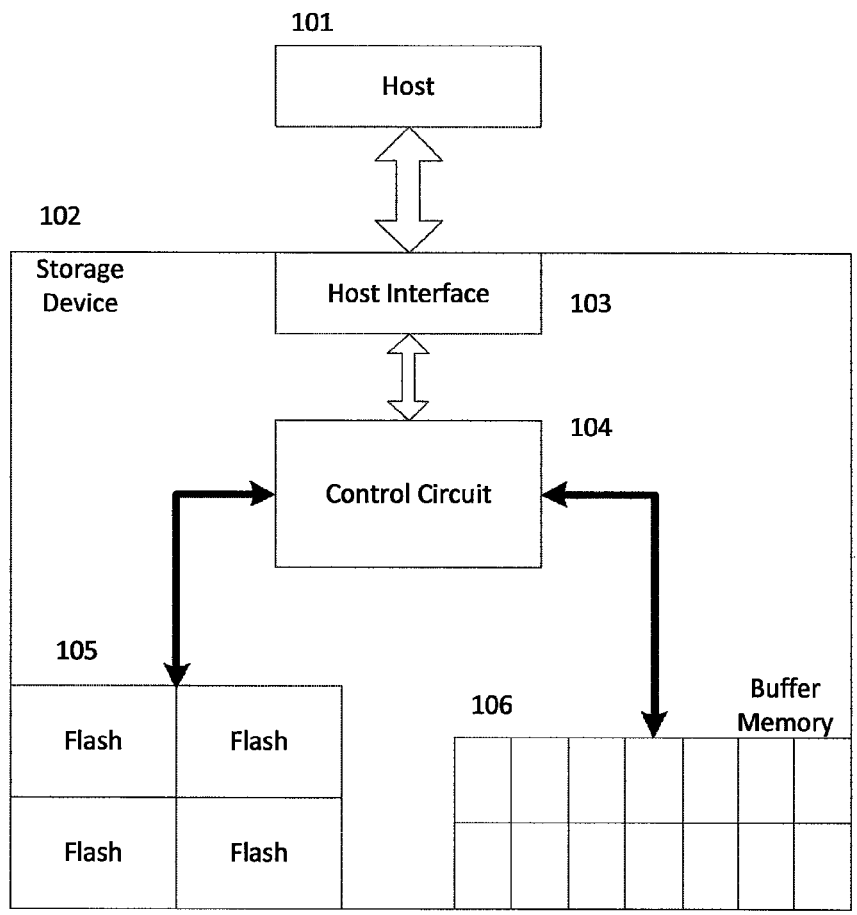
FIG. 1 is a block diagram of the storage device according to the embodiments of the present invention.

FIG. 1 is a block diagram of the storage device according to the embodiments of the present invention. The embodiment shown in FIG. 1 includes a host 101 and a storage device 102 coupled to the host 101. The host 101 may be coupled with the storage device 102 through multiple ways, including but not limited to such as SATA, IDE, USB, PCIE, SCSI, Ethernet, fibre channel, wireless communication network connecting the host 101 and the storage device 102. The host 101 can be the information processing device capable of communicating with the storage device through the ways above, for example, personal computer, tablet computer, server, portable computers, network switches, routers, cellular phones, personal digital assistant, etc. The storage device 102 includes a host interface 103, a control circuit 104, one or more flash memory chip 105 and a buffer memory 106. The host interface 103 may be adapted to the host 101 for exchanging data by such as SATA, IDE, USB, PCIE, SCSI, Ethernet, fibre channel, etc. The control circuit 104 is used for controlling the data transmission between the host interface 103, the flash memory chip 105 and the buffer memory 106, also for flash memory management, mapping of host logical address to physical address, wear-leveling, bad block management, etc. The control circuit 104 can be implemented by variety ways of software, hardware, firmware or combinations thereof. The control circuit 104 can be FPGA (Field-programmable gate array), ASIC (Application Specific Integrated Circuit) or their combination. The control circuit 104 can also include a processor or controller.

According to one embodiment of the invention, the host 101 sends a read command or a write command to the storage device 102. The control circuit 104 receives the read command or the write command via the host interface 103. In FIG. 2 the first written command 200 is described in detail as an example.

Figure 2A:
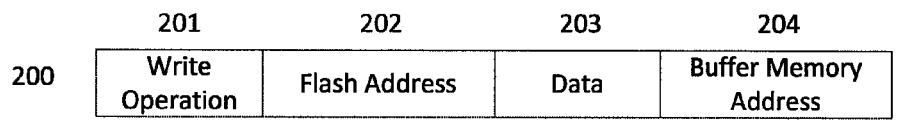
FIG. 2A, 2B is a schematic diagram according to the write command in the embodiments of the present invention.
Figure 2B:
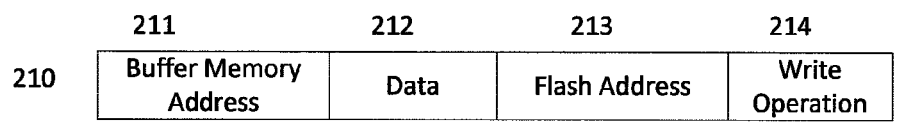

Referring to FIG. 2A, 2B, FIG. 2A is a schematic diagram of the write command according to the embodiment of the invention. Write command 200 includes fields 201, 202, 203 and 204. The field 201 indicates the command as the write command, the field 202 as the flash memory address, the field 203 as the data. The write command 200 indicates that the storage device 102 writes the data in the data field 203 to the flash memory chip 105 based on the flash memory address indicated by the field 202. The field 204 is the buffer memory address, when the storage device 102 receives the write command 200, it first writes the data in the data field 203 to the buffer memory 106 based on the flash memory address indicated by the field 204, then writes the data in the data field 203 to the buffer memory 105 based on the flash memory address indicated by the field 202. In one embodiment, the field 203 carries data to be written to the flash memory 105.

In one example, the storage device 102 will write the data in the data field 203 to the buffer memory 106 based on the buffer memory address indicated by the field 204, and then read the data from the buffer memory 106, then write the data to the flash memory chip 105. The operation of writing data to the buffer memory 106, with the operation of reading and writing another data out from the memory 106 to the flash memory chip 105 can be executed in parallel, thus the concurrency performance of the writing operation from the host 101 to the storage device 102 will be promoted, and the complexity of the control circuit 104 will not be significantly increased, because the control circuit 104 does not need to handle the space allocation tasks of the buffer memory 106. In one embodiment, the field 204 can be a complete address of the buffer memory 106, while in another embodiment, the field 204 is the offset value relative to a base address. In one embodiment, the field 203 carries the data to be written to the flash memory 105. In another embodiment, the field 203 may carry a pointer, which points to the data to be written to the storage device 102, and the data can be stored in the memory of the host 101, in which case, the storage device 102 can obtain the data from the host 101 through the subsequent DMA transmission process. Still in another embodiment, the field 203 can carry a pointer, which points to the data to be written to the storage device 102, and the data can be stored in the buffer memory of the storage devices 102. The field 202 may be the physical address or logical address of the flash memory chip 105 which the data to be written to. The field 202 can also be a pointer pointing to the buffer memory 106, in which the physical address or logical address of the flash memory chip 105 is stored. The conversion process from the logical address to the physical address, can be realized by looking up an address mapping table.

Person skilled in the relevant technical field will be easy to realize that the write command may have a variety of specific coding schemes and field orders. For example, as illustrated in FIG. 2B, field 214 indicating the write command 210 as the type of write operation can be at the end or any other location of the write command 210. The field 211 carries the buffer memory address, and the field 212 carries the data or pointers pointing to storage location of the data. In the field 213 it stores the flash memory address, or a pointer pointing to the storage of the flash memory address, in which the flash memory address can be a logical address or physical address.

FIG. 3 is a flow chart of the method of the storage device executing the write command according to the embodiments of the present invention. In step 301, the storage device 102 receives the write command 200 from the host 101. After the control circuit 104 of the storage device 102 receives the write command 200 through the host interface 103, it will extract, contained in the write command 200, the field 201 used for indicating the type of operation to be write operation, the field 202 used for indicating the flash memory address to be written, the field 203 used for indicating the data to be written, and the field 204 used for indicating the address of the buffer memory 106. In step 302, in response to the write command 200, control circuit 104 gets the address used for the buffer memory 106 based on the field 204, and gets the data to be written based on the field 203, and then writes the data to be written to the position in the buffer memory 106 indicated by the field 204. After writing data to the buffer memory 106, the storage device 102 may send a message to the host indicating the completion of executing the write command 200, although the data has not been actually written to the flash memory chip 105. In this way, it appears to the host 101 that, after the completion of step 302, the executing of the write command 200 has been completed, thus the performance of the storage device 102 executing the write command 200 is enhanced. Messages sent to the host can be contained in the interrupt request being sent by the storage device 102 to the host 101. Other appropriate transmit modes can also be chosen based on the coupling modes (SATA, IDE, USB, PCIE, SCSI, Ethernet, fibre channel, wireless communication network) between the host 101 and the storage device 102. After the data to be written is written to the buffer memory 106, under control of the control circuit 104, the data to be written indicated by the field 203 will be written to the flash memory chip 105 based on the flash memory address indicated by the field 202 (step 303). After writing data to the flash memory chip 105, the storage device 102 may also send a message to the host indicating the completion of executing the write command 200. In particular, the host may write data again to the address indicating the buffer memory 106 in the write command 200, and not cause data errors due to rewriting the data of the address. In one example, if the field 202 is indicating the logical address used for the flash memory chips 105, then the logical address will be converted into a physical address for the flash memory chip 105. The conversion mode from the logical address to physical address is known by person skilled in the technical field. In one example, in step 303, the written data is obtained again from the buffer memory 106, and then is written to the flash memory chip 105. Person skilled in the technical field will be aware that under control of the control circuit 104, the operation of writing data to the buffer memory 106 in step 302, and the operation of writing data to the flash memory 105 in step 303, can be executed concurrently. So, the storage device 102 can be processing multiple write commands simultaneously, wherein, in one moment, the control circuit 104 writes a first data to the buffer memory 106 based on a write command; while based on another write command, control circuit 104 will write a second data in the buffer memory 106 to the flash memory chip 105. The buffer memory 106 can be a dual port memory, so that when the first data is written to the buffer memory 106 via the first port, at the same time, the second data can be read from the buffer memory 106 via the second port. Person skilled in the technical field will be aware of the other modes of implementing the buffer memory 106, to support the simultaneous read and/or write operation on multiple pieces of data.

By carrying the field 204 used for indicating the address of the buffer memory 106 in the write command, the maintenance work of the buffer memory 106 is removed from the control circuit 104, and the host 101 will be more flexible in controlling the storage device 102.

FIG. 4 is the schematic diagram of the host according to the embodiment of the invention. FIG. 4 is a block diagram showing the software components of the host 400. The host 400 may be a personal computer, a server computer or other devices with computing capability. The host 400 includes one or more user applications 401, 402 and 403, and the operating system 404. The operating system 404 has a storage device driver 405. In the embodiment of the invention, the driver 405 comprises a buffer control block 406 in it, used to control the buffer memory 102 of the storage device 106 in the host 400. The buffer control block 406 is composed of a plurality of storage units (411, 412 . . . 41N), in which each storage unit (411, 412 . . . 41N) of the buffer control block 406 corresponds to a storage unit of the buffer memory 106, and records the working state of the corresponding storage unit in the buffer memory 106. In one embodiment, each of the storage units (411, 412 . . . 41n) in the buffer control block 406, records that the corresponding storage unit in the buffer memory 106 is free or already occupied. In a further embodiment, a read/write command being sent to the storage device 102 involves multiple storage units in the buffer memory, for example 2. In this case, the 2 storage units (411, 412) in the buffer control block 406 are associated together, and this relationship is also recorded in the storage units 411, 412, for example, one or more pointer pointing to the storage unit 412 is recorded in the storage unit 411. Still in a further embodiment, one or more pointer pointing to the storage unit 411 is also recorded in the storage unit 412.

FIG. 5 is a flow chart of the host executing write operation according to the embodiment of the invention. When a user application program or other programs requests executing the operation of writing data to the storage device, application program or other programs sends a write request. The storage device driver 405 in FIG. 4 receives the write request (step 501), which includes data to be written and addresses used for the storage device provided by the application program or other programs. The address used for the storage device can be a file path and the offset value, and can be further converted to a logical address used for the storage device. In one example, the logical address is used for the flash memory chip on the storage device, and the write request is to write the data based on the logical address to the flash memory chip. In step 502, the storage device driver 405 will allocate free buffer memory for the write request. Specifically, traverse the buffer control block 406, finds the storage unit in free state, for example, the storage unit 411. The storage unit 411 in free state shows that the corresponding storage unit in the buffer memory 106 in the storage device 102 is in free state, and it can receive the written data.

In step 503, the storage device driver 405 sends a write command to the storage device 102, in which the write command includes the data to be written and addresses used for the storage device 102, and it also includes the address used for the buffer memory 106 corresponding to the storage unit 411. Person skilled in the technical field will be aware that there are various ways to obtain the correspondence between the storage unit 411 and buffer memory 106. For example, the buffer control block 406 has N storage units (411, 412 ... 41N), and the buffer memory 106 also includes N storage units, in which the storage unit 411 corresponds to the first storage unit in the buffer memory 106, and the storage unit 412 corresponds to the second storage unit in the buffer memory 106, and similarly, the storage unit 41n corresponds to the Nth storage unit in the buffer memory 106, so that based on the position of the storage unit 411 in the buffer control block 406 the address of the corresponding storage unit in the buffer memory 106 can be calculated. Still as an example, it can also store the address of the corresponding storage unit in the buffer memory 106 in the storage unit (411, 412 ... 412). In still another example, the write command carries a sequence number, which not only indicates the position of the storage unit 411 in the buffer control block 406, but also the position of the corresponding storage unit in the buffer memory 106.

In step 504, the message is received from the storage device 102. In one example, the message is an interrupt request which indicates that the write command sent in step 503 has been executed. As previously mentioned, in one example, after the data in the write command is written to the buffer memory 106 by the control circuit 104 in the storage device 102 (in particular, it is written to the storage unit in the buffer memory 106 corresponding to the storage unit 411 in the buffer control block 406), the storage device will send an interrupt, indicating the completion of the write command. In one example, after the control circuit 104 writes the data to the flash memory chip 105, the storage device 102 will send an interrupt to host 101. In one example, the interrupt request also includes information indicating the storage unit of the buffer control block 406 related to the write command sent in step 503. This information can be one or more storage unit (411, 412 ... 41N) address, or one or more storage unit (411, 412 ... 41N) serial number.

In step 505, in response to the interrupt request received in step 504, and based on the information of the storage unit of the buffer control block 406 that related to the write command indicated by the interrupt request, the storage units (411, 412, ... 41N) of the buffer control block 406 related to the write command will be released. Releasing the storage unit (411, 412 ... 41N) can be specifically setting in the storage unit (411, 412 ... 41N) the corresponding storage unit in the buffer memory 106 to be in free state.

In one example, the write command in step 503 involves two storage units 411 and 412 of the buffer control block 406, and, the storage unit 411 and 412 record the pointers pointing to each other separately, to show that the two storage unit 411, 412 are associated to the same write command. In the received interrupt request in step 504, it can either indicate the storage unit 411 or indicate the storage unit 412. In step 505, based on one of the pointers pointing to the storage unit 411 and 412, two storage units 411 and 412 can be obtained, and then released. Similarly, Person skilled in the technical field will be aware that in this way three or more storage units (411, 412 ... 41N) can also be associated in the write command.

Figure 6:
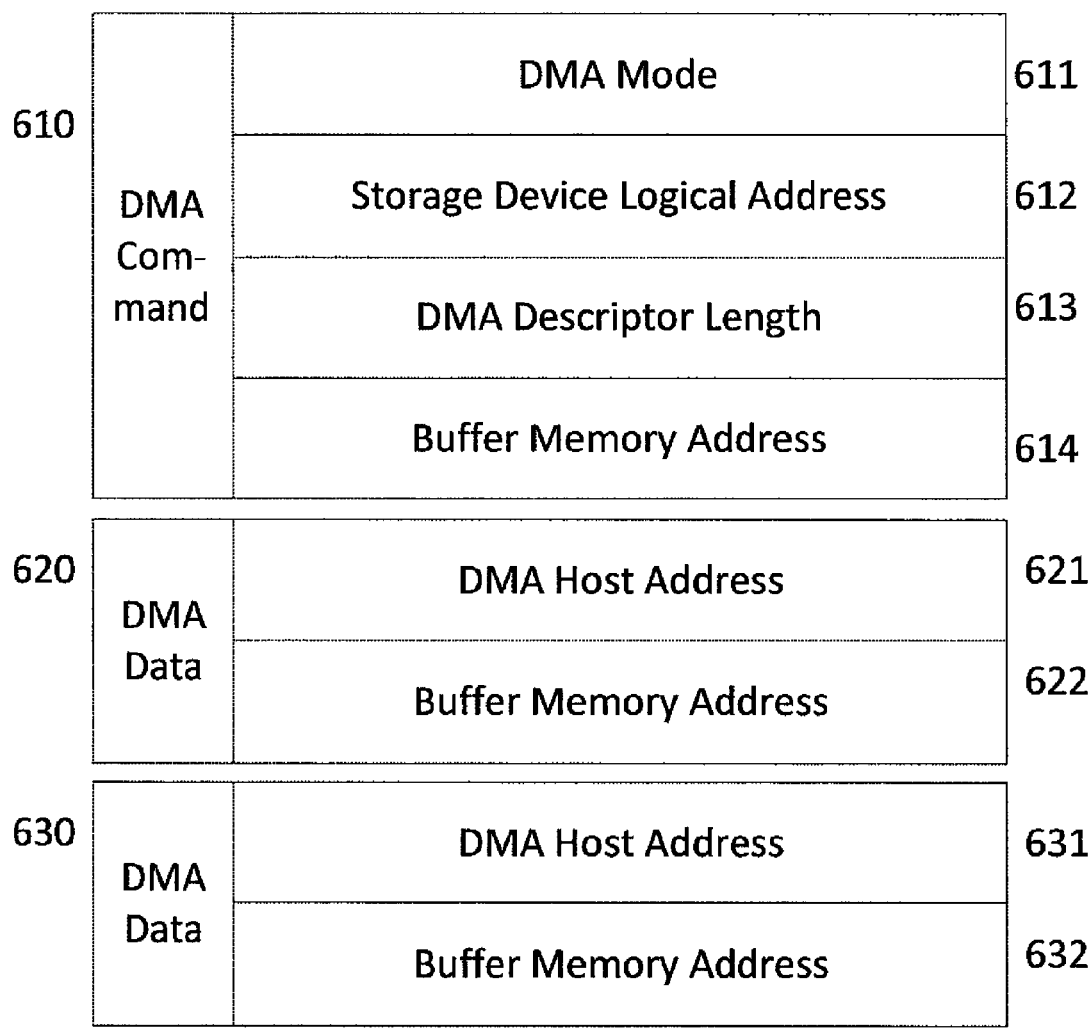
FIG. 6 is a schematic diagram of second write command according to the embodiment of the present invention.

FIG. 6 is the schematic diagram of the second write command according to the embodiment of the present invention. The second write command indicates the storage device 102 to obtain data from the host 101 by DMA and write the data to the flash memory chip 105. The second write command can be a DMA descriptor 600. The DMA descriptor 600 includes a DMA command 610 and one or more DMA data (620, 630). The DMA command 610 includes a field 611, indicating the DMA mode, namely, the operation indicated by the DMA descriptor 600, which can do read, write, erase or other operation to the flash memory. The field 612 indicates the logical address of the storage device. The field 613 indicates the length of the DMA descriptor 600, namely, the number of DMA data (620, 630) included in the DMA descriptor 600, which can be 1 or more. The field 614 indicates the address of the buffer memory 106. The DMA data 620, 630 each includes the field 621 and 631, indicating the host address in the DMA transmission. The DMA data 620, 630 also each includes the field 632 and 622 respectively, indicating the address of the buffer memory 106.

The logical address of the storage device in the field 612 of the DMA command 610 can be used for DMA data 620, 630. In the case of the DMA descriptor 600 including only the DMA data 620, the storage device 102, based on the host address indicated by the field 621 and the buffer memory address indicated by the field 622, starts DMA transmission between the host 101 and the storage device 102, and ultimately stores the received data to the flash memory chip 105 indicated by the field 612. In the case of the DMA descriptor 600 including the DMA data 620 and 630, the storage device 102 executes the DMA transmission data based on the DMA data 620 and ultimately stores the data in the flash memory chip 105, and the storage device 102 will also execute the DMA transmission data based on the DMA data 630, and ultimately stores the data in the flash memory chip 105 indicated by the field 612 plus a predetermined offset value. In other words, the DMA descriptor 600 can indicate the multiple DMA transmission between the host 101 and the storage device 102, each DMA transmission corresponding to one of the DMA data 620, 630, each DMA transmission transmitting the same amount of data (e.g. 4K bytes), and the logical address of the DMA transmission storage device corresponding to the DMA data 620 and DMA data 630 is continuous (e.g., at a distance of a predetermined offset value, which can be corresponding to the amount of the DMA transmission data). Thus it can carry only one logical address of the storage device in the DMA descriptor 600 (field 612). The two DMA host addresses of the DMA transmission (field 621, 631) corresponding to the DMA data 620 and 630 can be uncontinuous, which may support the Scatter-Gather DMA transmission mode.

In the DMA transmission corresponding to the DMA data 620, the DMA host address data indicated by the field 621 is written to the buffer memory 106 indicated by the field 622, and then written to the flash memory chip 105. In the DMA transmission corresponding to the DMA data 630, the DMA host address data indicated by the field 631 is written to the buffer memory 106 indicated by the field 632, and then written to the flash memory chip 105.

The field 614 is optional. In the buffer memory address corresponding to the field 614, as an example, the length of the field 613 indicated by the DMA descriptor 600 can be saved. Thus it can record how many of the DMA transmissions corresponding to the multiple DMA data 620, 630 have been executed and how many have not yet. For the DMA descriptor 600, when all the DMA transmissions corresponding to the DMA data 620, 630 have been executed, for example, after the corresponding data is written to the flash memory chip 105, the storage device 102 will send an interrupt to the host 101 indicating the completion of executing the DMA descriptor 600. Thus, although the DMA descriptor 600 is corresponding to two DMA transmission processes, but it will only send one interrupt to host 101. Reducing the interrupt request will help decrease the work load of the host 101.

Figure 7A:
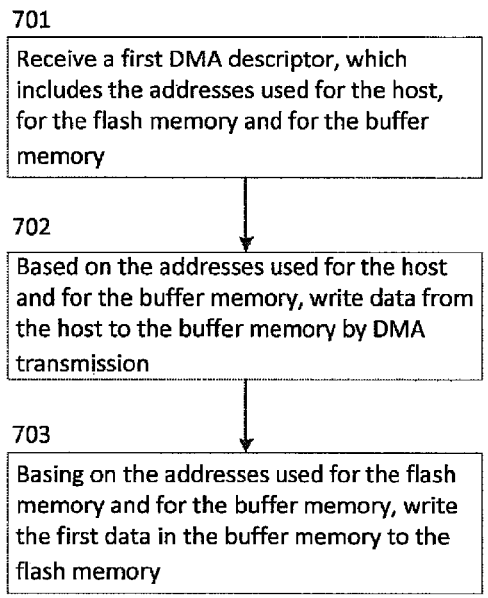
FIG. 7A, 7B is a flow chart based on the second write command executed by the storage device according to the embodiments of the present invention.
Figure 7B:
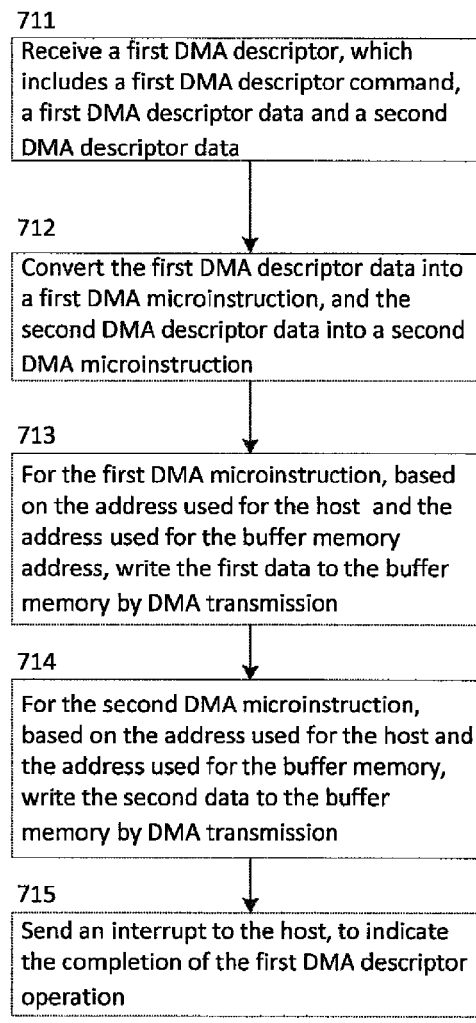

FIG. 7A, 7B is a flowchart of the storage device executing the second write command according to the embodiments of the present invention. The second write command can be the descriptor 600 shown in FIG. 6. As illustrated in FIG. 7A, in step 701, the storage device 102 receives the DMA descriptor 600. The DMA descriptor 600 includes the addresses used for the host (for example, the DMA host addresses 621, 631), for the flash chip 105 (for example, the logical address of the storage device 612) as well as for the buffer memory 106 (for example, buffer memory addresses 622, 632). Although in FIG. 6 the DMA descriptor 600 includes the DMA commands 610, DMA data 620, 630, but it is only for a clear express. The DMA command 610, DMA data 620, 630 can also be combined together. The storage device 102 extracts the addresses for the host, for the flash memory chip 105 as well as for the buffer memory 106 from the DMA descriptor 600.

In step 702, based on the addresses used for the host and for the buffer memory, the storage device 102 writes data from the host 101 to the buffer memory 106 by DMA transmission. In step 703, based on the addresses used for the flash memory and for the buffer memory, the data written to the buffer memory in step 702 is written to the flash memory chip 105.

In one example, in step 702, after the data is written to the buffer memory 106, an interrupt is sent to the host, indicating the completion of executing the DMA transmission. If the DMA descriptor 600 only includes this DMA transmission (e.g., DMA descriptor 600 includes only the DMA command 610 and DMA data 620), the interrupt also indicates the completion of executing the DMA descriptor 600. In one example, in step 703, after the data is written to the flash memory chip 105, an interrupt is sent to the host 101 sends, indicating the completion of executing the DMA transmission.

As illustrated in FIG. 7B, it shows the more detailed process of processing the DMA descriptor 600 containing multiple DMA data (620, 630). In step 711, the storage device 102 receives the DMA descriptor 600, which includes the DMA command 610, DMA data 620 and 630.

In step 712, based on the DMA descriptor 600, the DMA data 620 will be converted into the first DMA microinstruction, and the DMA data 630 will be converted into the second DMA microinstruction. The first DMA microinstruction comprises the DMA host address 621 and the buffer memory address 622. Based on the first DMA microinstruction, it can also obtain the logical address 612 of the storage device corresponding to the first DMA microinstruction, the DMA operation type and the DMA descriptor length 613. The logical address 612 of the storage device and the DMA operation type can be a part of the first DMA microinstruction, and can also be stored in the buffer memory 106, and can be accessed through the index in the first DMA microinstruction, and can also identify the operation type of the first DMA microinstruction by placing the first DMA microinstruction in the specific operation queue (read, write, erase, etc.).

Still as another example, for the first DMA microinstruction, based on the buffer memory address 622 and a predetermined offset, a pointer stored in the buffer memory 106 is obtained. Based on the pointer the logical address 612 of the storage device 612 and/or the DMA descriptor length 613 will be obtained. In a similar way, for the second DMA microinstruction, based on the buffer memory address 632 and a predetermined offset a pointer stored in the buffer memory 106 is obtained. Based on the pointer the logical address 612 of the storage device and/or the DMA descriptor length 613 will be obtained.

In the preferred embodiment, based on the buffer memory address 614, the DMA descriptor length 613 is stored in the buffer memory 106, in which the DMA descriptor length is equal to the number of the DMA data in the DMA descriptor 600 (or the total number of the DMA command and DMA data in the DMA descriptor 600, out of which the number of the DMA data can be got) and the DMA descriptor length 613 is accessed via the index in the DMA microinstruction. Thus, the execution sequence of the first DMA microinstruction and second DMA microinstruction becomes unimportant. Each execution of a DMA instruction will decrease the DMA descriptor length of the buffer memory 106 progressively (for example, minus 1 or minus unit length), and when the DMA descriptor length of the buffer memory 106 becomes 0, it means that the execution of all the DMA operation to the DMA descriptor 600 is completed.

In step 713, for the first DMA microinstruction, based on the DMA host address 621 and buffer memory address 622, the data will be written to the buffer memory 106 by DMA transmission.

In step 714, for the second DMA microinstruction, based on the DMA host address 631 and buffer memory address 632, the corresponding data will be written to the buffer memory 106 by DMA transmission.

In step 715, an interrupt is sent to the host, to indicate the completion of the DMA descriptor 600 operation.

In an example, step 713 also includes writing the data corresponding to the first DMA microinstruction which will be written to the buffer memory 106, based on the logical address of the storage device 612, to the flash memory chip 105. Step 714 also includes writing the data corresponding to the second DMA microinstruction which will be written to the buffer memory 106, based on the logical address of the storage device 612 plus a predetermined offset value, to the flash memory chip 105.

In the preferred embodiment, in step 713, 714, after writing the corresponding data to the buffer memory 106, also based on the index in the first, second microinstructions, it will access to the DMA descriptor length stored in the buffer memory 613, and decrease the DMA descriptor length 613 progressively (for example, minus 1 or minus unit length). Thus, when the DMA descriptor length 613 becomes 0, it means that the operation to the DMA descriptor 600 is completed. In this way, it can process simultaneously multiple DMA descriptors 600 in the storage device 102, and the execution sequence of the first DMA microinstruction and second DMA microinstruction is unimportant. Other ways can also be used to identify the multiple DMA data in the DMA descriptors 600 being executed. For example, it will provide flags for each DMA data of each DMA descriptor 600 in the buffer memory or registers, whenever a DMA data (DMA microinstruction) is executed, setting the corresponding flags. It can also sequentially execute each DMA data (DMA microinstruction) of the DMA descriptor 600, when the last DMA data (DMA microinstruction) is executed, meaning the execution of the DMA descriptor 600 completed.

In still another embodiment, when each DMA microinstruction of the DMA descriptor 600 is executed, an interrupt will be sent to the host 101, and it will be analyzed by the host driver whether the execution of the DMA descriptor 600 has been completed. The analytical method is similar to identifying whether the multiple DMA data of the DMA descriptor 600 in the storage devices 102 have been executed.

Figure 7C:
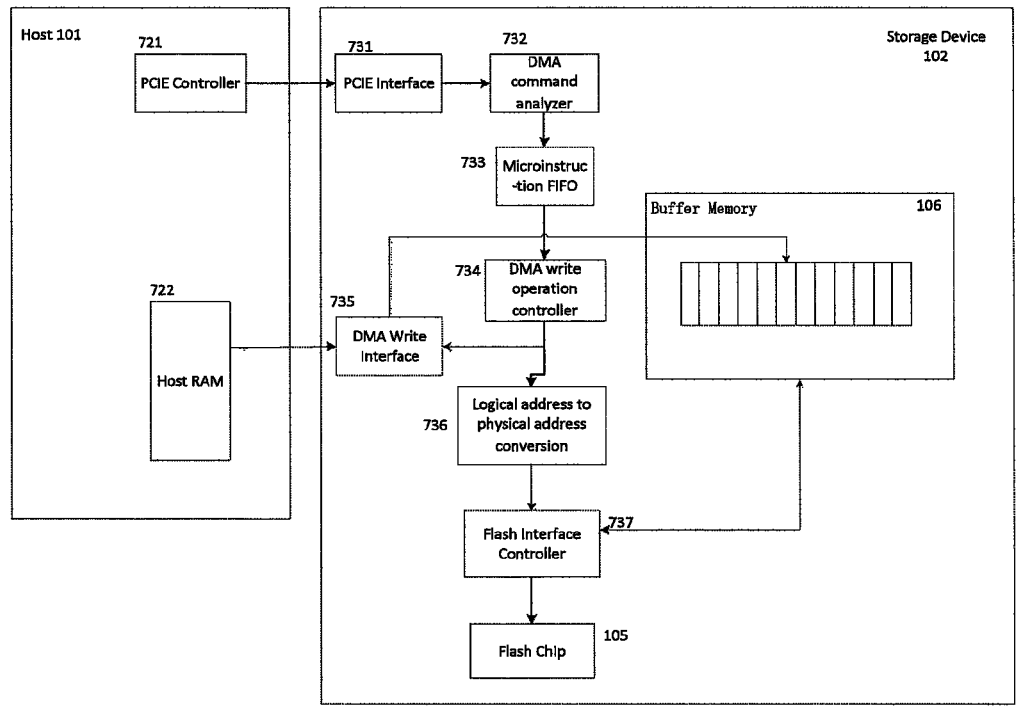
FIG. 7C shows a hardware block diagram for the implementation of the storage device which executes the second write command in FIG. 7A, 7B.

FIG. 7C shows a hardware block diagram of the storage device executing the second write command in FIG. 7A, 7B. In FIG. 7C, the host 101 includes a PCIE controller 721 and a host memory 722. The host memory 722 can be a random access memory (RAM), and the PCIE controller 721 can be used for communicating with the storage device via the PCIE bus. The storage device 102 includes a PCIE interface 731, a DMA command analyzer 732, a microinstruction FIFO (FIFO buffer) 733, a DMA write operation controller 734, a DMA write interface 735, a logical address to physical address conversion circuit 736, a Flash interface controller 737, a flash memory chip 105 and a buffer memory 106.

The PCIE interface 731 receives the DMA descriptor 600 sent from the host 101 through the PCIE controller 721. The connection between the host 101 and the storage device 102 is not limited to PCIE, and can also be the SATA, IDE, USB, PCIE, SCSI, Ethernet, fibre channel, etc. The DMA command analyzer 732 will convert the DMA descriptor 600 received by the PCIE interface 731 into the DMA microinstruction. As for the DMA descriptor 600 shown in FIG. 6, it includes the DMA data 620 and DMA data 630, and then the DMA command analyzer will convert them into the first DMA microinstruction corresponding to the DMA data 620 and the second DMA microinstruction corresponding to the second DMA data 630. The structure of the first DMA microinstruction and the second DMA microinstruction has been introduced above in detail. The DMA command analyzer 732 also extracts the DMA descriptor length from the DMA command 610 of the DMA descriptor 600, and stores it in the buffer memory 106, a register or analogues. The DMA descriptor length indicates the number of DMA data included in the DMA descriptor 600, and also indicates the number of the DMA microinstructions obtained from the DMA descriptor 600. The DMA command analyzer 732 will store the first DMA microinstruction and second DMA microinstruction in the microinstruction FIFO 733.

The microinstruction FIFO 733 can cache the DMA microinstruction, and in a way of FIFO provides DMA microinstructions to the DMA write operation controller 734. Although here only takes the write operation as an example, it is described that the DMA microinstruction corresponding to the DMA write operation is cached in the microinstructions FIFO 733. Person skilled in the technical field will be aware that the DMA microinstruction corresponding to the DMA read operation and the DMA microinstruction corresponding to the DMA write operation can be mixedly cached in the microinstruction FIFO 733. The microinstruction FIFO 733 can also be configured into two or more parts, of which one part is dedicated to storing the DMA microinstruction corresponding to the DMA read operation, and the other part is dedicated to storing the DMA microinstruction corresponding to the DMA write operation.

As for the DMA microinstruction corresponding to the DMA write operation, for example, the first DMA microinstruction and second DMA microinstruction mentioned before, the DMA write operation controller 734 will execute the DMA write operation based on the DMA microinstructions. As previously mentioned, the first DMA microinstruction includes the DMA host address 621 and the buffer memory address 622. The DMA write operation controller 734, using the DMA host address 621 and the buffer memory address 622, initiates the DMA write operation via the DMA interface 735 between the host 101 and the storage device 102, and it will transmit the data stored in the DMA host address 621 to the position indicated by the buffer memory address 622, wherein the transmitted data can have a predetermined length (e.g. 4K bytes). As for the second DMA microinstruction, the DMA write operation controller 734 will executer a similar operation, transmitting the data stored in the DMA host address 631 to the position indicated by the buffer memory address 632.

From the first DMA microinstruction and second DMA microinstruction, the logical address used for the respective storage device can be obtained. In the logical address to physical address conversion circuit 736, the logical address of the storage device for each DMA microinstruction is converted to the physical address used for the flash memory chips 105. As for each of the DMA microinstruction, the Flash interface controller 737 will write the data written in the buffer memory 106, based on the physical address provided by the logical address to physical address conversion circuit 736, to the flash memory chip 105.

The Flash interface controller 737, based on the index in the first and second microinstructions, accesses the stored DMA descriptor length extracted from the DMA command 610 of the DMA descriptor 600, and decrease the DMA descriptor length progressively (for example, minus 1 or minus unit length). Thus, when the DMA descriptor length is 0, it means the completion of the DMA descriptor 600 operation. Then, an interrupt can be sent to the host to indicate the completion of the DMA descriptor 600 operation. In one example, the DMA write operation controller also accesses to the stored DMA descriptor length, and determines whether all data corresponding to the DMA descriptor 600 have been written to the buffer memory 106, and sends the host the interrupt indicating that all data have been written to the buffer memory 106.

Figure 8:
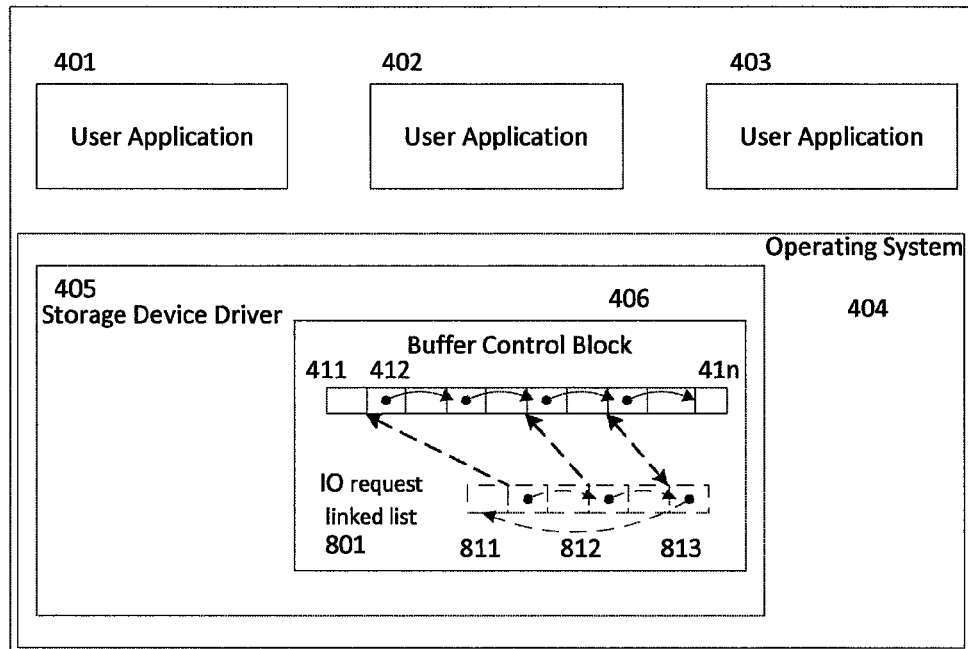
FIG. 8 is a software block diagram of the host according to the embodiment of the invention.

FIG. 8 is a block diagram of the host's software according to the embodiment of the invention. FIG. 8 shows the block diagram of the host 800's software, which is similar to the host's software block diagram shown in FIG. 4. The difference is that in FIG. 8, the buffer control block 406 also includes the IO request linked list 801. The IO request linked list 801 is consisting of the storage units (411, 412 . . . 41N) in the buffer control block 406. The IO request linked list 801 can be a one-way linked list, double linked list or circular linked list. When generating the DMA descriptor 600 as shown in FIG. 6, for a 600 DMA descriptor, a corresponding IO request linked list 801 is created, including the storage units (811, 812, 813) respectively corresponding to the DMA command 610, the DMA data 620, and the DMA data 630. It should be pointed out that the storage unit (811, 812, 813) is the three storage units of the storage units (411, 412, . . . 41N) in the buffer control block 406, and by setting the corresponding pointer, it forms the IO request linked list 801. In FIG. 8, the storage units (811, 812, 813) and the storage units (411, 412 . . . 41N) being displayed separately, is just the need of describing clearly.

Figure 9A:
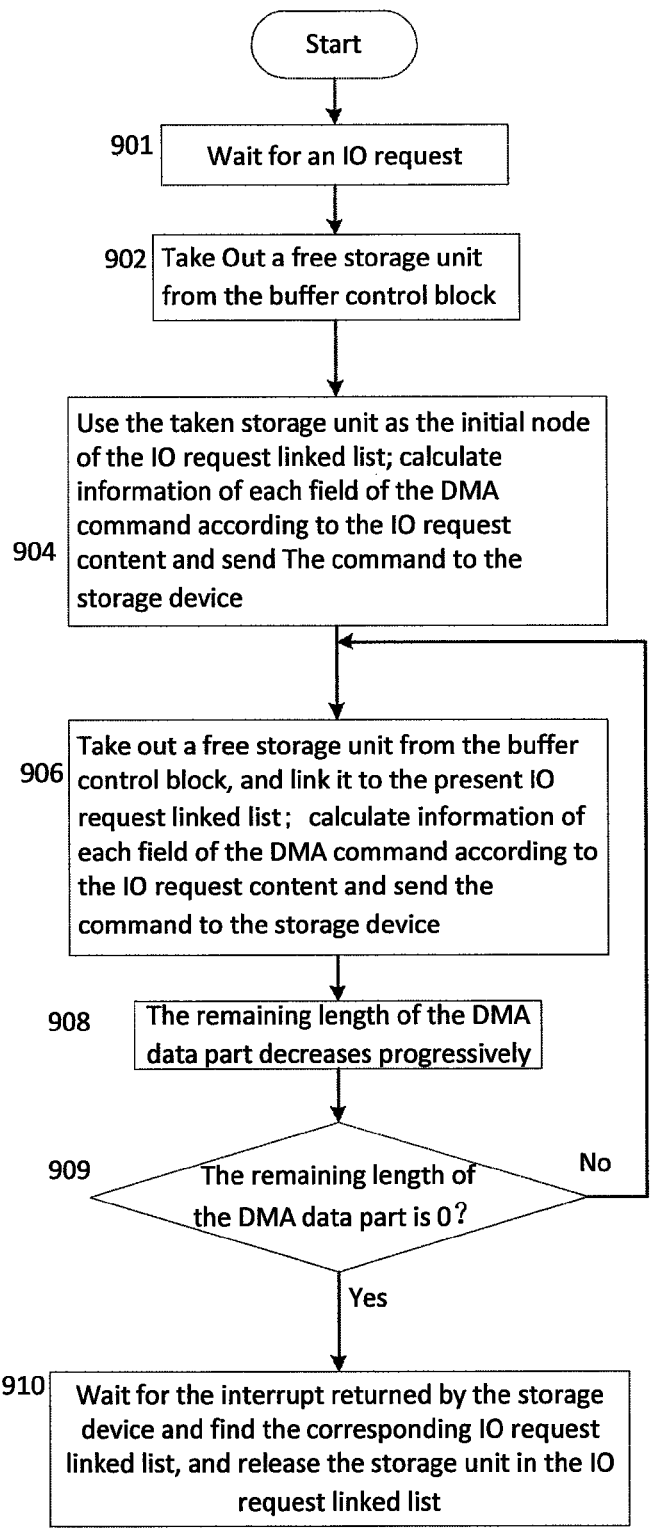
FIG. 9A is a flow chart of the host creating and executing the second write command according to the embodiment of the invention.

FIG. 9A is a flow chart of the host creating and executing the second write command according to the embodiment of the invention. In one embodiment, step 901, the IO request is received by the host's storage device driver 405. The IO request will indicate that the multiple data blocks dispersed in different physical addresses of the host memory will be written to the storage device 102, so the scatter-gather DMA operation will be executed between the host and the storage device. The following will describe the operation process of the host writing data to the storage device by way of example.

In step 902, referring to FIG. 8, an storage unit in free state is taken out from the buffer control block 406, such as the storage unit 411.

In step 904, according to the content of the IO request, it will create the DMA command 610 of the DMA descriptor 600, fill in with the DMA mode field 611 of the DMA command 610 (in this example, a write operation), the storage device logical address field 612 (the information can be obtained from the IO request), the DMA descriptor length field 613 (the information can be obtained from the IO request) and the buffer memory address field 614 (corresponding to the storage unit 411 allocated in step 902). Then the DMA command 610 created will be sent to the storage device 102. And the storage unit 411 will be used as the initial node (for example the storage unit 811) of the IO request linked list 801 of the IO request. An IO request linked list 801 is created, and is used for after the storage device 102 executing the DMA descriptor 600, returning the memory unit occupied back to the buffer control block 406, and notifying application software or other software of the completion of the IO request execution. For this purpose, in one example, the pointer corresponding to the IO request will also be stored in the storage unit 411. Based on the DMA descriptor length, it can also obtain the remaining length of the DMA data. Before creating the first DMA data, the remaining length of the DMA data part is the number of the DMA data (620, 630) in the DMA descriptor 600, which, as an example, is the DMA descriptor length minus 1.

In step 906, a storage unit in free state is taken out from the buffer control block 406, for example, the storage unit 412. According to the content of the IO request, it will create the DMA data 620 of the DMA descriptor 600, fill in with the DMA host address field 621 of the DMA data 620 (the information can be obtained from the IO request), and the buffer memory address 622 (corresponding to the allocated storage unit 412, for example, the offset value or serial number of the storage unit 412 in the buffer control block 406). And then the created DMA data 620 will be sent to the storage device 102. The storage unit 412 will be used as the node (for example the storage unit 812) of the IO request linked list 801 of the IO request.

In step 908, the remaining length of the DMA data part will be decreased progressively, and the number of DMA data in the DMA descriptor 600 having not yet been sent to the storage device will be obtained.

In step 909, if the remaining length of the DMA data part is 0, it means that the generation of the DMA descriptor 600 has been completed, and then in step 910 the storage device driver 405 will wait for the interrupt returned by the storage device 102 indicating the completion of the DMA descriptor 600 processing, and on the basis of the interrupt find the corresponding IO request linked list 801, and release the storage unit (811, 812) in the IO request linked list 801. In other words, setting the storage units (811, 812) of the IO request linked list 801 in free state, the storage units 411, 412 being in free state can be known via the buffer control block 406. In one example, in the case of the DMA descriptor 600 indicating a read operation, and the host 101's CPU including a cache memory, it will also notice the CPU cache memory associated with the DMA host addresses (621, 631) of the DMA descriptor 600 to execute a consistency processing, in order to reflect that the data in the DMA host address (621, 631) may be changed by the DMA read operation. In one example, the interrupt returned by the storage device 102 includes the content indicating one of the multiple storage units (811, 812) in the IO request linked list 801 (or one of the buffer memory address 622, 632), according to which content, the storage units (811, 812) will be released through the IO request linked list 801.

In step 909, if the remaining length of the DMA data part is larger than 0, it means that the generation of the DMA descriptor 600 has not yet been completed, and it also need to generate one or more DMA data for the IO request, and then the process will return to step 906 and repeat steps 906, 908 and 909.

Figure 9B:
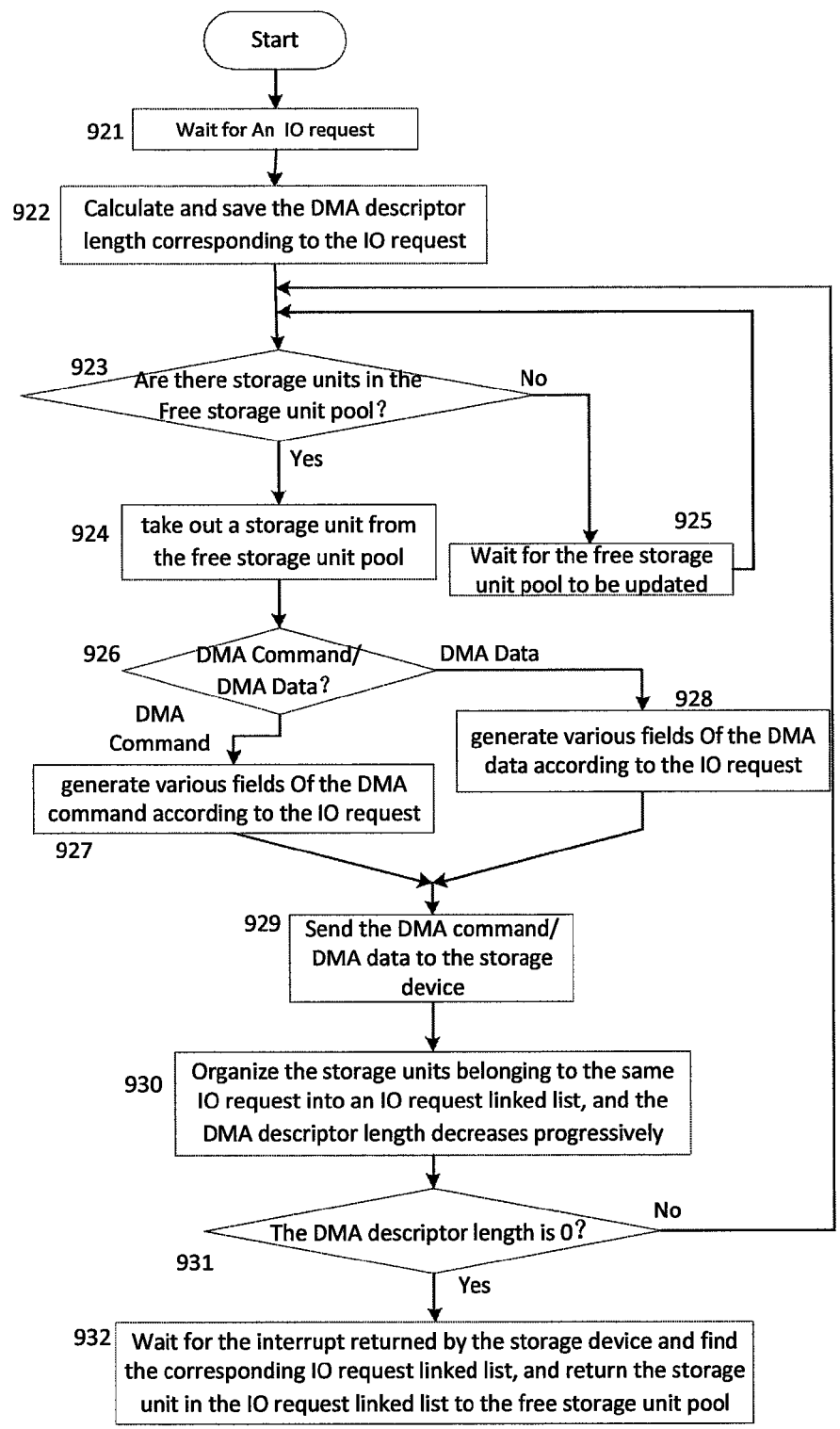
FIG. 9B is a flow chart of the host creating and executing the second write command according to another embodiment of the invention.

FIG. 9B is a flowchart of the host creating and executing the second write command according to another embodiment of the present invention. In this embodiment, the free storage units in the buffer control block 406 are further organized as an free storage unit pool, to contribute to the creating process of the DMA descriptor 600. It will form the free storage unit pool by organizing the free storing units (411, 412 . . . 41N) in the buffer control block 406 into a linked list. When needing to obtain the free storage unit from the buffer control block 406, the storage unit can be removed from the free storage unit pool, thus eliminating the expenditure of searching for a free storage unit in the buffer control block 406.

In one embodiment, in step 921, the IO request is received by the storage device host driver 405. Similar to FIG. 9A, the IO request indicates that the multiple data blocks dispersed in the different physical addresses of the host memory are written to the storage device 102, for which the scatter-gather DMA operation will be executed between the host and the storage device.

In step 922, according to the content of the IO request, it will calculate the length of the DMA descriptor used for corresponding to the same IO requests (for example, the DMA command and the number of the DMA data). It can be noted that in the embodiment shown in FIG. 9A, it is in step 904 creating the DMA command 610 that the DMA descriptor length is obtained, which will remind Person skilled in the technical field that each step is not necessarily implemented in the order disclosed in the embodiment.

In step 923, it determines if the free storage unit pool is empty. If the free storage unit pool is not empty, meaning the buffer control block 406 has storage units in free state, then it will proceed to step 924, and take out an free storage unit from the free storage unit pool (for example, the storage unit 411). If the free storage unit pool is empty, meaning that the buffer control block 406 has no free storage unit. Then in step 925, it should wait for the free storage unit pool being updated, for the appearance of a free storage unit. When the execution of the DMA descriptor is completed, the related storage unit will be released, resulting in new free storage unit in the free storage unit pool. This will be covered in more details later.

In step 926, determine currently whether to generate the DMA command field or the DMA data field for the DMA descriptor 600. In general, the DMA descriptor 600 includes a DMA command and one or more DMA data. When generating the DMA command, the processing will proceed to step 927, and according to the content of the IO request, it will create the DMA command 610 of the DMA descriptor 600, and fill in each fields (611, 612, 613, 614) of the DMA command 610. In one example, the pointer corresponding to the IO request is also stored in the storage unit 411, so that after the execution of the IO request is completed, the IO request can be identified and the application software or other upper level software can be informed. When generating the DMA data, the processing will proceed to step 928, and according to the content of the IO request, it will create the DMA command 620 of the DMA descriptor 600, and fill in each fields (621, 622) of the DMA command 620.

Then, in step 929, the generated DMA command or the DMA data will be sent to the storage device 102. And in step 930, the storage unit 411 obtained in step 924 is set in the IO request linked list 801. As an example, the first storage unit filled in the IO request linked list 801, will serve as the head node of the IO request linked list 801. However, it will also be realized that when the IO request linked list 801 is organized into a circular linked list, it has no "head node" in it. In step 930, the DMA descriptor length will also be decreased progressively.

In step 931, if the DMA descriptor length is 0, it means that the generation of the DMA descriptor 600 has been completed, and then in step 932 the storage device driver 405 will wait for the interrupt returned from the storage device 102 indicating the completion of processing the DMA descriptor 600, and on the basis of the interrupt find the corresponding IO request linked list 801, and release the storage units (811, 812) in the IO request linked list in 801. In other words, so setting the storage units (811, 812) in the IO request linked list 801 to free state the storage units 411, 412 will be known in free state through the buffer control block 406, and the storage units 411, 412 will be returned to the free storage unit pool. In one example, the interrupt returned from the storing device 102 includes the content indicating one of the multiple storage units (811, 812) of the IO request linked list in 801, on the basis of which content the storage unit (811, 812) will be released through the IO request linked list 801.

In step 931, if the DMA descriptor length is larger than 0, then it means that the generation of the DMA descriptor 600 has not yet been completed, and one or more DMA data also need to be generated for the IO request. Then the process will return to step 923 and repeat steps 923-931.

It describes the generation process of the DMA descriptor 600 referring to FIG. 9A, 9B diagram above. The DMA descriptors 600 is used for describing the multiple DMA operations executed in scatter-gather DMA, wherein the multiple DMA operations' data come from the storage in a storage space continuous or not. Person skilled in the technical field will be easy to aware that the generation types of the DMA descriptor 600 include but are not limited to the specific types described above in FIG. 9A, 9B.

Figure 10A:
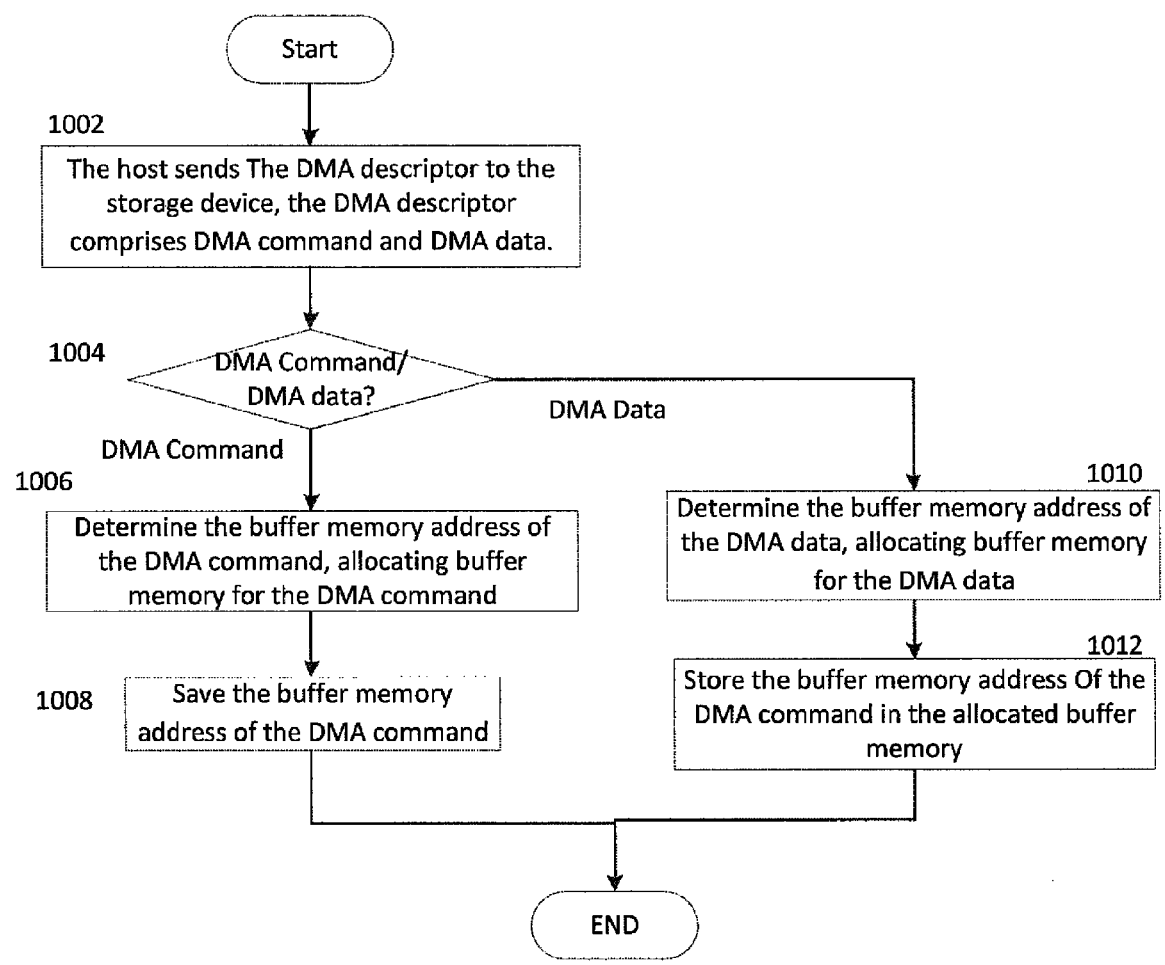
FIG. 10A is a flow chart of creating linked list in the buffer memory of the storage device according to an embodiment of the present invention.

FIG. 10A is a flow chart of creating the linked list in the buffer memory of the storage device according to the embodiment of the invention. In the process of processing DMA descriptor 600 in storage device disclosed in FIG. 7A-7C, the DMA descriptor 600 is converted into one or more microinstructions. In a further embodiment, in order to effectively process the relationship (for example, the microinstructions are all associated to the DMA descriptor 600) between the one or more microinstructions, the storage device 102, in response to the DMA descriptor 600 transmitted by the host 101, will create a linked list in the buffer memory 106, with which the multiple microinstructions corresponding to the same DMA descriptor 600 will be associated.

As shown in FIG. 10A, in step 1002, the host 101 sends the DMA descriptor 600 to the storage device 102. The DMA descriptor 600 includes the DMA command 610 and the DMA data 620, 630. It has been combining with FIGS. 9A and 9B above to describe the example of the process of the host 101 sending the DMA descriptor 600 to the storage device 102. It should also be aware that creating the linked list in the buffer memory of the storage device will contribute to the execution of the IO operations by the storage device, especially the concurrent/out-of-order execution of the multiple IO operations, and the multiple IO operations can be linked together by accessing the linked list of each other. Thus the IO operations without associations can be executed concurrently in the storage device. As a result, it can also respond to other types of IO commands or other commands except the DMA command, in order to create a linked list in the storage device.

In step 1004, it determines whether the DMA command 610 or the DMA data 620, 630 is received.

If the DMA command 610 is received, in step 1006, it will extract the buffer memory address used for the DMA command 610 from the buffer memory address field 610, and based on the buffer memory address, allocate storage space for the DMA command 610 in the buffer memory 106. Next, in step 1008, the buffer memory address allocated for the DMA command 610 will be saved, which is used for allocate the buffer memory address for the DMA data 620, 630.

If it determines that the one received in step 1004 is the DMA data 620, then in step 1010, it will extract the buffer memory address used for the DMA data 620 from the buffer memory address field 622 of the DMA data 620, and based on the buffer memory address, allocate storage space for the DMA command 620 in the buffer memory 106. And in step 1012, in the storage space allocated for the DMA command 620 in the buffer memory 106, the buffer memory address of the DMA command 610 stored in step 1008 will be stored. Thus, in the buffer memory 106, the storage space allocated for the DMA command 610 and the DMA data 620 will form a linked list, of which the storage space allocated for the DMA command 610 is the head node of the linked list, and the storage space allocated for the DMA data 620 is linked to the head node of the linked list.

In the case of the DMA descriptor 600 also including the DMA data 630, through steps 1010 and 1012, based on the buffer memory address 632 in the DMA data 630, the storage space is allocated for the DMA data 630 in the buffer memory 106, and in the storage space allocated for the DMA data 630 in the buffer memory, the buffer memory address of the DMA command 610 will be stored. Person skilled in the technical field will be aware that it can also store the buffer memory address used for the DMA data 620 in the storage space allocated for the DMA data 630 in the buffer memory 106, so that different types of linked lists will be formed. In other examples, the storage space allocated for the DMA command 610 and the DMA data 620, 630 in the buffer memory 106 will be created as a circular list or double linked list.

It has been described above combined with FIG. 7A, 7B, 7C that the storage device 102 generates the DMA microinstructions based on the DMA data (620, 630), and stores them in the microinstruction FIFO 733. The operation of generating the DMA microinstructions from the DMA data (620, 630) can occur after step 1012, and the buffer memory address allocated for the DMA data (620, 630) is carried in the DMA microinstructions.

Figure 10B:
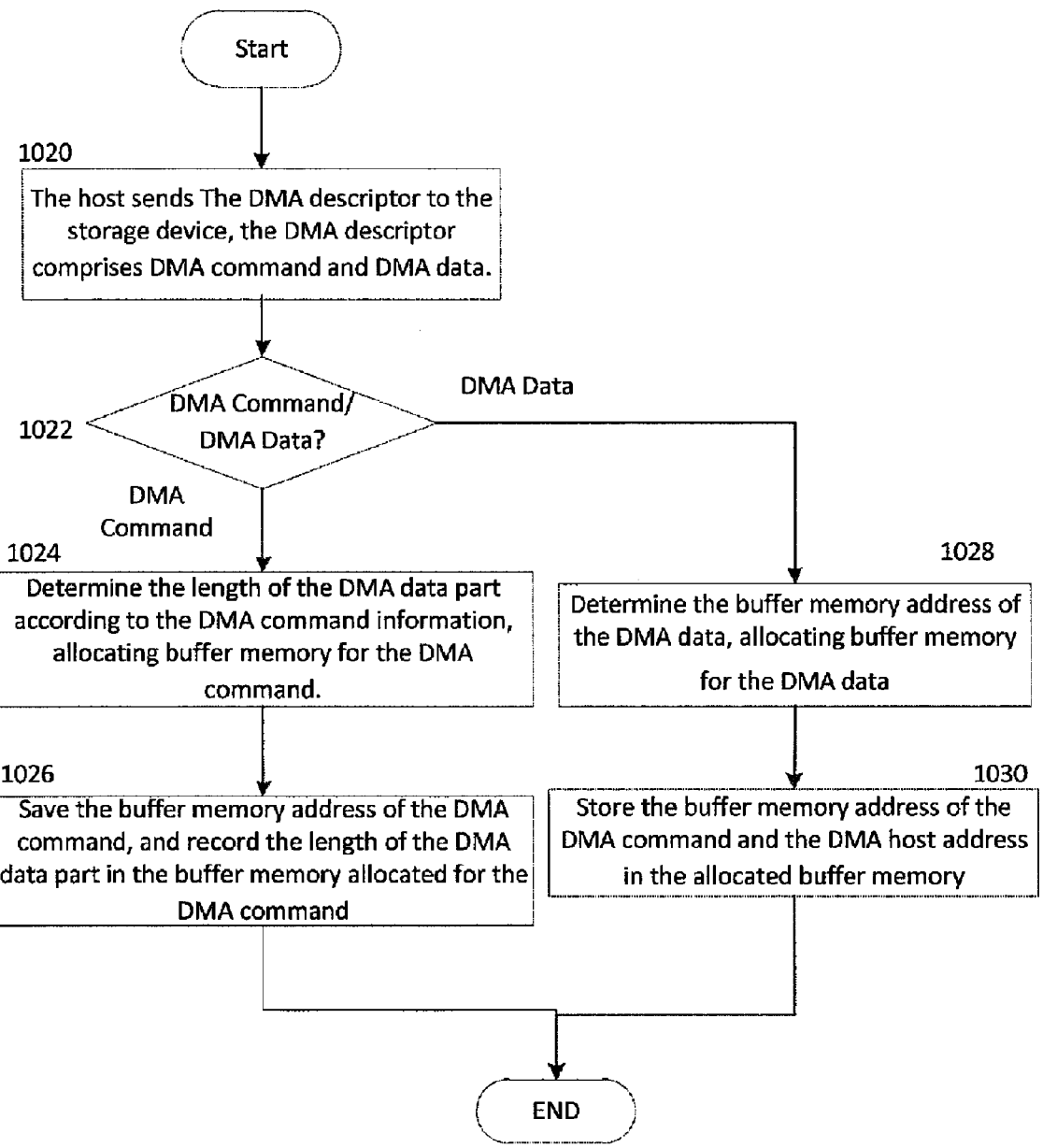
FIG. 10B is a flow chart of creating linked list in the buffer memory of the storage device according to an embodiment of the present invention.
Figure 10C:
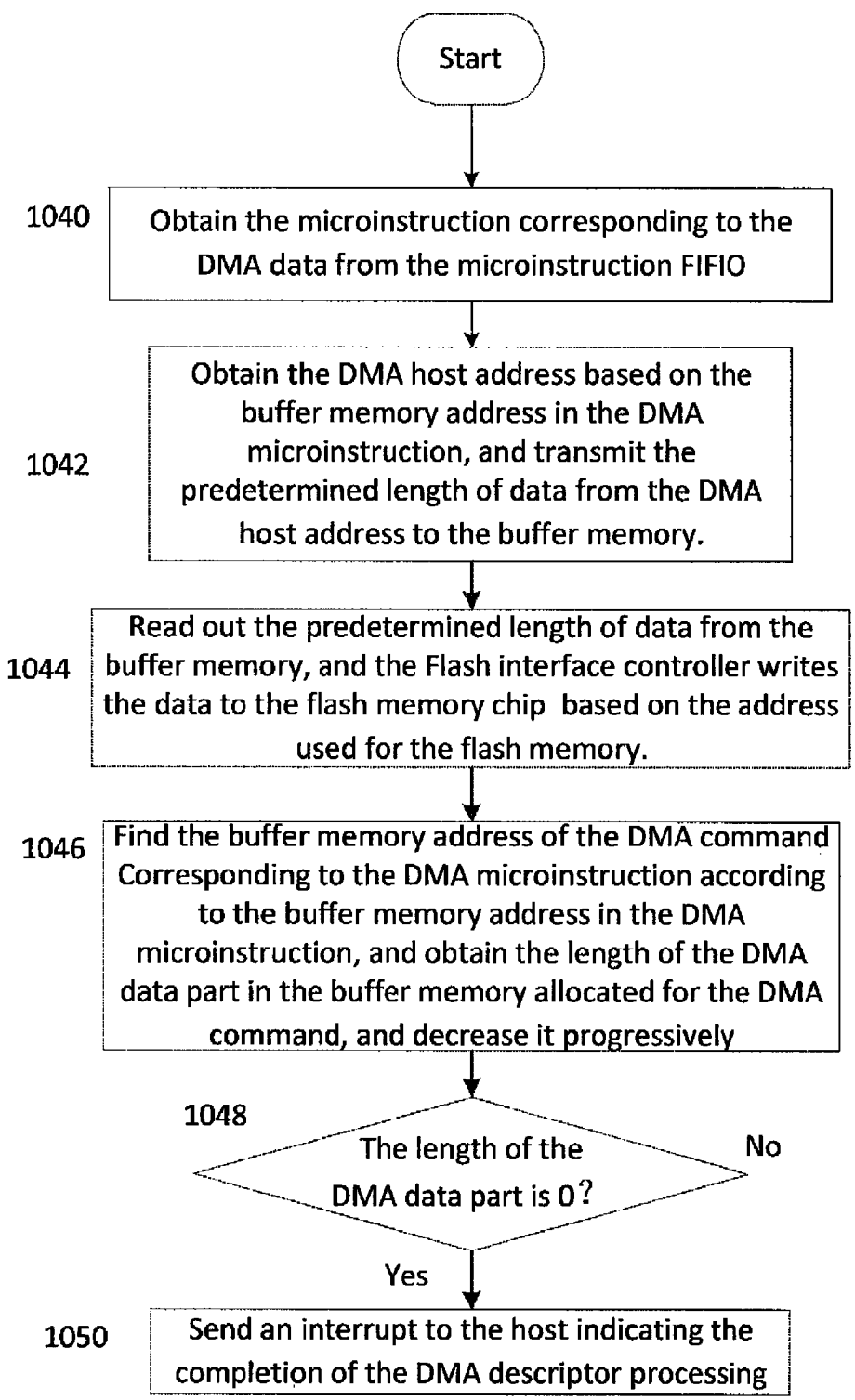
FIG. 10C is a flow chart of the storage device using the created linked list in the buffer memory for executing the DMA descriptors according to an embodiment of the present invention.

FIG. 10B is the flow chart of creating linked lists in the buffer memory of the storage device according to the embodiment of the present invention. Compared with the embodiment provided in FIG. 10A, the embodiment in FIG. 10B, will also store the information related to the processing or execution of the DMA descriptors in the created linked list. FIG. 10C is the flow chart of the storage device using the linked list created in the buffer memory to execute the DMA descriptor according to the embodiment of the present invention. FIG. 11A-11F shows multiple states of the buffer memory associated with FIG. 10B and FIG. 10C. In FIG. 11A-11F, 1100 indicates the storage space in the buffer memory 106.

Specifically, in step 1020, the host 101 sends the DMA descriptor 600 to the storage device 102.

In step 1022, it determines whether the received command is the DMA command 610 or DMA data 620, 630.

If the DMA command 610 is received, in step 1024, it will extract the buffer memory address from the buffer memory address field 610, and based on the buffer memory address, allocate storage space for the DMA command 610 in the buffer memory 106. As illustrated in FIG. 11A, the storage space 1101 is allocated for the DMA command 610. And also the DMA descriptor length field 613 is extracted from the DMA command 610, and the DMA data part length of the DMA descriptor 600 can be obtained from the DMA descriptor length 613 (e.g., the DMA descriptor length minus 1). Next, in step 1026, the buffer memory address allocated for the DMA command 610 is saved, for allocating buffer addresses for the DMA data 620, 630. And, the DMA data part length is recorded in the buffer memory allocated for the DMA command 610. As illustrated in FIG. 11A, the DMA data part length is saved in the storage space 1101 (in this example, the DMA data part length is 2).

If it determines that the one received in step 1022 is the DMA data 620, then in step 1028, it will extract the buffer memory address used for the DMA data 620 from the buffer memory address field 622 of the DMA data 620, and based on the buffer memory address, allocate storage space for the DMA command 620 in the buffer memory 106. As illustrated in FIG. 11B, the storage space 1112 is allocated for the DMA data 620. And in step 1030, in the storage space 1112 allocated for the DMA command 620, the buffer memory address of the DMA command 610 stored in step 1026 will be stored. Thus, in the buffer memory 106, the storage space (1101 and 1112) allocated for the DMA command 610 and the DMA data 620 will form a linked list, of which the storage space 1101 allocated for the DMA command 610 is the head node of the linked list, and the storage space 1112 allocated for the DMA data 620 is linked to the head node of the linked list. Also the DMA host address corresponding to the DMA data 620 is stored in the storage space 1112.

In the case of the DMA descriptor 600 also including the DMA data 630, through steps 1028 and 1030, based on the buffer memory address 632 in the DMA data 630, the storage space 1123 is allocated for the DMA data 630 in the buffer memory 106 (referring to FIG. 11C), and in the storage space 1123, the buffer memory address of the DMA command 610 will be stored. And the DMA host address corresponding to the DMA data 630 is also stored in the storage space 1123.

As a result, in the buffer memory 106, a linked list corresponding to the DMA descriptor 600 is formed, of which the storage space 1101 is the head node of the linked list, and the storage space 1112 and 1123 are the nodes pointing to the head node of the linked list. Person skilled in the technical field will be aware that it can also store the buffer memory address used for the DMA data 620 in the storage space 1123 allocated for the DMA data 630 in the buffer memory 106, so that different types of linked lists will be formed. In other examples, the storage space allocated for the DMA command 610 and the DMA data 620, 630 in the buffer memory 106 will be created into a circular list or double linked list.

FIG. 10C is the flow chart of the storage device using the linked list created in the buffer memory to execute the DMA descriptor according to the embodiment of the present invention. It has been described above combined with FIG. 7A, 7B, 7C that the storage device 102 generates the DMA microinstructions based on the DMA data (620, 630), and stores them in the microinstruction FIFO 733. During the execution of the DMA microinstructions by the storage device 102, in one example, the linked list in the buffer memory 106 is used. The DMA microinstruction includes the buffer memory address, through which it can obtain the storage space in the buffer memory 106 allocated by the DMA data corresponding to the DMA microinstruction, and then it can obtain the DMA host address corresponding to the DMA data and the DMA data part length or the DMA data number in the DMA descriptor corresponding to the DMA data.

It is described in the following, that the DMA microinstruction corresponding to the DMA data 620 will be indicated with the first DMA microinstruction, and the DMA microinstruction corresponding to the DMA data 630 will be indicated with the second DMA microinstruction.

In step 1040, the first DMA microinstruction is obtained from the microinstruction FIFO 733.

In step 1042, the first DMA microinstruction includes the address of the storage space 1112 of the buffer memory 106 allocated for the DMA data 620, and obtains the DMA host address from the storage space 1112. The DMA host address is provided by the DMA host address field 621 in the DMA data 620. Based on the DMA host address, it will execute the DMA transmission between the host 101 and the storage device 102, transmitting a predetermined length (e.g., 4 KB) of data in the DMA host address of the host 101 to the buffer memory of the storage device 102 by way of DMA transmission. For the second DMA microinstruction, similar operation will be executed, transmitting the host 101's data in the DMA host address provided by the DMA host address field 632 of the DMA data 630 to the storage space 1123 allocated for the DMA data 632 in the buffer memory of the storage device 102 by way of DMA transmission. In FIG. 11D, it shows the storage space 1112 and 1123 storing the data transmitted by way of DMA transmission after the execution of the first DMA microinstruction and second DMA microinstruction.

In step 1044, it continues to the execute the first DMA microinstruction. Through the address of the storage space 1112 in the first DMA microinstruction, a predetermined length of data is removed from the storage space, which data is transmitted in step 1042 from the host 101 to the storage space 1112 of the buffer memory 106 by way of DMA operation. And through the flash interface controller (for example, Flash interface controller 737 in FIG. 7C) the data is written to the flash memory chip 105 based on the address used for the flash memory included in the first DMA microinstruction. The address used for the flash memory is obtained through the storage device logic address field 612 in the DMA command 610. The second DMA microinstruction will be executed in a similar way. Through the address of the storage space 1123 included the second DMA microinstruction, a predetermined length of data is removed from the storage space, and through the flash interface controller the data is written to the flash memory chip 105 based on the address used for the flash memory included in the second DMA microinstruction. The address used for the flash memory included in the second DMA microinstruction, is obtained through the storage device's logic address field 612 in the DMA command 610 plus a predetermined value (for example the length of data corresponding to the DMA transmission, which is 4 KB in this example). In one example, the storage device's logical address in the DMA command 610 is converted into the storage device's physical address, and the data is written to the flash memory chip 105 based on the physical address. The mapping process from the storage device's logical address to physical address, should be well known by person skilled in the technical field.

Figures 11E, 11F:
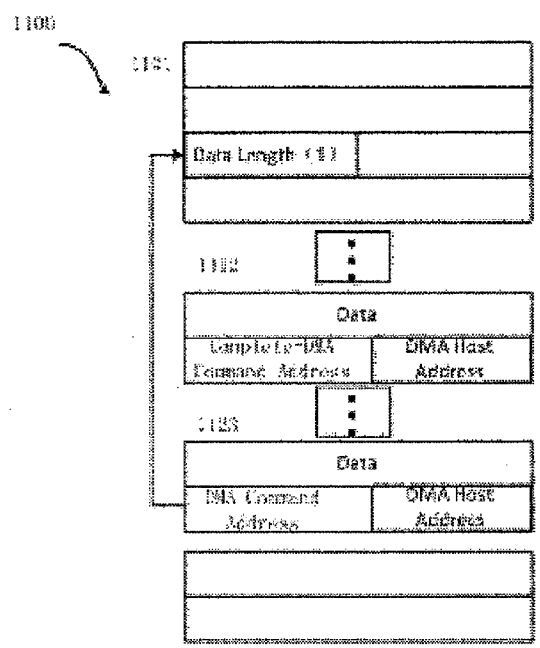

In step 1046, it continues to execute the first DMA microinstruction. The address of storage space 1101 allocated for the DMA command 610 is obtained through the address of the storage space 1112 in the first microinstruction, and the length of DMA data part is obtained in the storage space 1101, and the length of the DMA data part stored in the storage space 1101 is decreased progressively (for example, minus 1 or minus the unit length). As illustrated in FIG. 11E, as for the first DMA microinstruction, after the length of the DMA data part is decreased progressively, its value is changed from 2 to 1. And the address of the storage space 1101 is no longer saved in the storage space 1112, to indicate the completion of executing the DMA data 620. In step 1048, as the length of the DMA data part is not 0, it means that the DMA descriptor 600 operation is not completed, because it also contains another DMA data 630, at this time, with no further processing.

When the second DMA microinstructions is being executed in step 1046, through the address of the storage space 1123 in the second DMA microinstruction, the address of storage space 1101 allocated for the DMA command 610 is obtained, and the length of DMA data part is obtained in the storage space 1101, and the length of the DMA data part stored in the storage space 1101 is decreased progressively (for example, minus 1 or minus the unit length). As illustrated in FIG. 11F, as for the second DMA microinstruction, after the length of the DMA data part is decreased progressively, its value is changed from 1 to 0. And the address of the storage space 1101 is no longer saved in the storage space 1123, to indicate the completion of executing the DMA data 630.

At this moment, when the second DMA descriptor is being executed in step 1048, as the length of the DMA data part is 0, it means that the DMA descriptor 600 operation has been completed. Next, in step 1050, an interrupt is sent to the host 101, to indicate that the operation of the DMA descriptor 600 has been completed.

Again as illustrated in FIG. 11F, the address of storage space 1101 is no longer saved in either of the storage space 1112 and 1123. The length of the DMA data part in the storage space 1101 is 0. In this case, it means that the DMA descriptor 600 execution has been completed, and the storage space 1101, 1112 and 1123 will not be used again, the storage space of which can be released for other DMA descriptor execution. In one example, the release and reuse of the corresponding storage space is controlled by the host 101, it has been combined with FIGS. 9A and 9B above to described the release of the storage space in the IO request linked list 801. As the storage units (411, 412 . . . 41N) in the buffer control block 406 are corresponding to the storage spaces in the buffer memory 106, the release of the storage space in the IO request linked list 801 means that the storage spaces 1101, 1112 and 1123 in the buffer memory are released.

It has been described above combined with FIG. 10B, 10C, 11A-11F the scheme of storing the DMA host addresses corresponding to the first and second microinstructions in the buffer memory 106, which makes the DMA microinstructions not have to carry the DMA host address and reduces the occupation of the circuit resources, and associates the first, second DMA microinstructions corresponding to the same DMA descriptor 600 through the buffer memory 106. Person skilled in the technical field will be aware that the storage device's logical address and/or the DMA host address corresponding to the first and second microinstructions can also be stored in the buffer memory, so as to further reduce the length of the DMA microinstruction and the occupation of the circuit resources.

Figure 12:
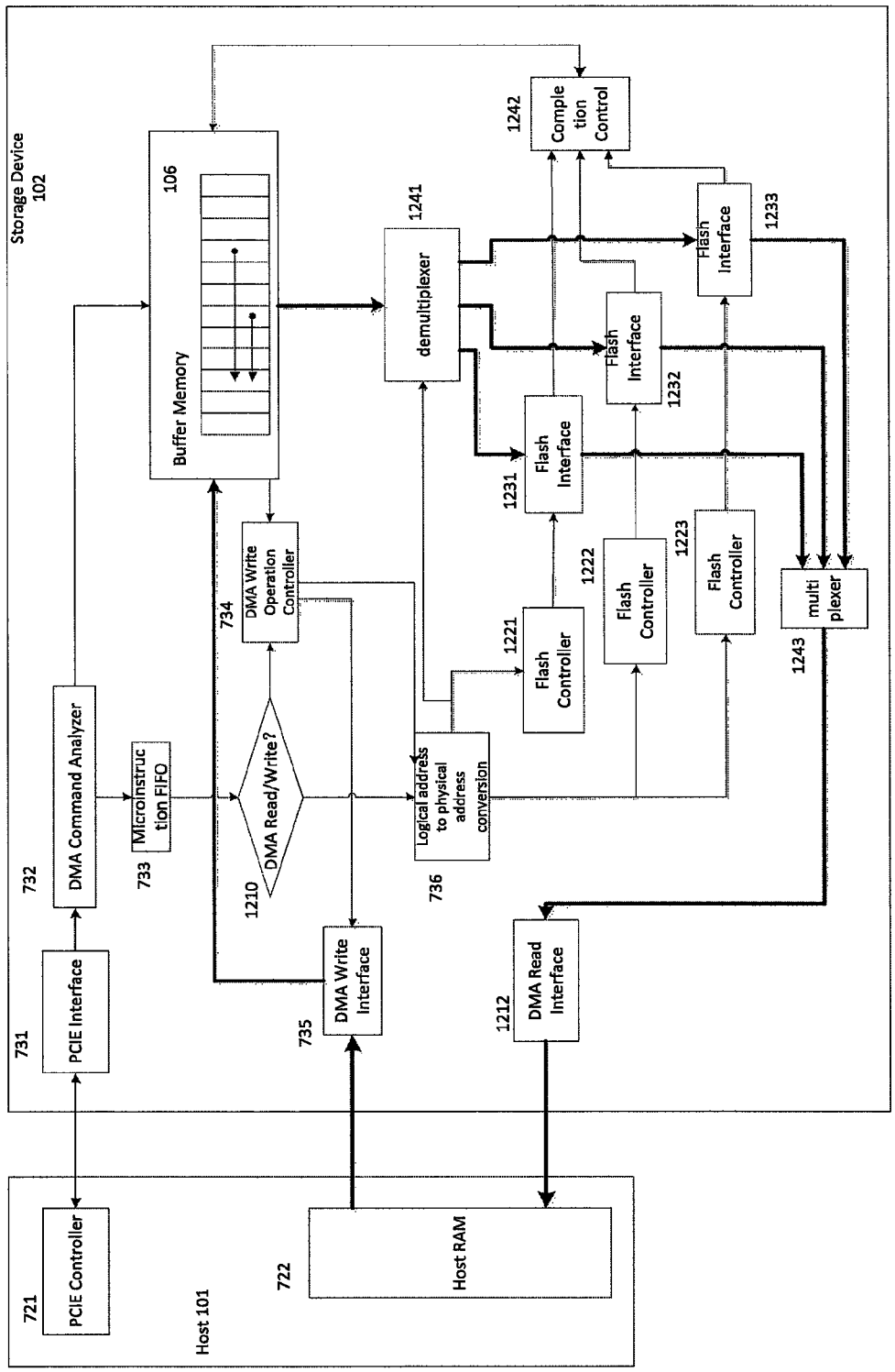
FIG. 12 is a structure block diagram of the storage device according to another embodiment of the invention.

FIG. 12 is the hardware block diagram of the storage device according to another embodiment of the invention. Similar to which is disclosed in FIG. 7C, the host 101 includes a PCIE controller 721 and a host memory 722. The storage device 102 includes a PCIE interface 731, a DMA command analyzer 732, a microinstruction FIFO buffer 733, a DMA write operation controller 734, a DMA write interface 735, the logical address to physical address conversion circuit 736 and a buffer memory 106. The storage device 102 also includes a DMA read-write microinstruction judging circuit 1210, a DMA read interface 1212, flash controllers 1221, 1222, 1223, flash memory interfaces 1231, 1232, 1233, completion control circuit 1242, a demultiplexer 1241 and a multiplexer 1243. The flash memory interfaces 1231, 1232, 1233 are coupled to the flash memory chip 105.

The PCIE interface 731 receives the DMA descriptor 600 sent by the host 101 through the PCIE controller 721. The connection between the host 101 and the storage device 102 is not limited to PCIE. The DMA command analyzer 732 converts the DMA descriptor 600 received by the PCIE interface 731 into the DMA microinstruction. As to the DMA descriptor 600 shown in FIG. 6, the DMA command analyzer will convert it into the first DMA microinstruction corresponding to the DMA data 620 and the second DMA microinstruction corresponding to the DMA data 630. In one example, the first and second DMA microinstructions respectively include the field indicating the microinstruction types (read/write/erase/other), the field indicating the addresses of the corresponding storing units in the buffer memory 106, and the field indicating the logical addresses of the storage device.

As illustrated in FIG. 10B and FIG. 11C, the DMA command analyzer 732 also allocates the storage units in the buffer memory 106 for the DMA command 610, and stores the length of the DMA data part in it. The DMA command analyzer also allocates the storage units in the buffer memory 106 for the DMA command 620, and stores the storage unit addresses allocated for the DMA command 610 and the DMA host address in the DMA data 630 in it.

The DMA command analyzer 732 will store the first DMA microinstruction and second DMA microinstruction in the microinstruction FIFO 733.

The microinstruction FIFO 733 can cache the DMA microinstructions, and provide DMA microinstructions to the DMA read-write microinstruction judging circuit 1210 according to the First-In-First-Out mode.

In the DMA read-write microinstruction judging circuit 1210, the type of the DMA microinstruction will be determined. For the DMA microinstructions corresponding to the DMA write operation, for example, the first DMA microinstruction and second DMA microinstruction mentioned above, the DMA write operation controller 734 will execute the DMA write operation based on these DMA microinstructions. The DMA write operation controller 734 uses the fields in the first DMA microinstruction indicating the storage unit addresses in the buffer memory 106 corresponding to the first DMA microinstruction, to obtain the DMA host address from the buffer memory 106, and to initiate write operations through the DMA write interface 735 between the host 101 and the storage device 102, and to transmit the data stored in the DMA host address to the storage unit of the buffer memory 106 corresponding to the first DMA microinstruction, of which the data transmitted can have a predetermined length (e.g. 4K bytes). For the second DMA microinstruction, the DMA write operation controller 734 uses the fields in the second DMA microinstruction indicating the storage unit addresses in the buffer memory 106 corresponding to the second DMA microinstruction, to obtain the DMA host address from the buffer memory 106, and to initiate write operations through the DMA write interface 735 between the host 101 and the storage device 102, and to transmit the data stored in the DMA host address to the storage unit of the buffer memory 106 corresponding to the second DMA microinstruction.

The logical addresses used for the respective storage device will be obtained from the fields, indicating the logic address of the storage device, of the first DMA microinstruction and second DMA microinstruction. In the logical address to physical address conversion circuit 736, it will convert the storage device's logical addresses of each DMA microinstructions into physical addresses used for the flash memory chips 105. For each DMA microinstruction, the Flash controller 1221, 1222, 1223, based on the physical address provided by the logical address to physical address conversion circuit 736, will write the data written in the buffer memory 106 to the flash memory chip 105 through the flash memory interface 1231, 1232, 1233, among which, the Flash controller 1221 is coupled to the flash interface 1231, the Flash controller 1222 is coupled to the flash interface 1232, the Flash controller 1223 is coupled to the flash interface 1233. And the flash memory interfaces 1231, 1232, 1233 are respectively coupled to their flash memory chips. Thus for the physical address used for the flash memory chips 105 which is converted from the logical address of the storage device in the DMA microinstruction, the physical address indicates a specific flash chip, which is coupled to a specific one of the flash memory interface 1231, 1232, 1233. Therefore, based on the physical address, it can be determined which of the flash memory interfaces 1231, 1232, 1233 can be used to write the data to the flash memory chips, and also which of the Flash controller 1221, 1222, 1223 can be used. The flash memory interface 1231, 1232, 1233 can also be coupled to the buffer memory through the demultiplexer 1241. Based on the physical address, the demultiplexer 1241 can transmit the data from the buffer memory to a specific one of the flash memory interface 1231, 1232, 1233.

After the flash memory interface 1231, 1232, 1233 writing data to the flash memory chip 105, the completion control circuit 1242 accesses to the buffer memory 106 based on the fields in the first and second DMA microinstructions indicating the storage unit addresses in the corresponding buffer memory 106, and further accesses the storage unit allocated for the DMA commands 610 in the buffer memory, to obtain the length of the DMA data part, and decrease it progressively (e.g., minus 1 or minus unit length). Thus, when the length of the DMA data part of the storage unit allocated for the DMA command 610 is 0, it means that the DMA descriptor 600 operation is completed. Then, an interrupt can be sent to the host, to indicate the completion of the DMA descriptor 600 operation.

Although in FIG. 12 by way of examples it shows embodiments including three Flash controller 1221, 1222, 1223 and three flash memory interface 1231, 1232, 1233, Person skilled in the technical field will be aware that multiple different number of flash controllers and flash memories can be used to match the number of the flash memory chips.

For the DMA microinstructions corresponding to the DMA read operation, the DMA read-write microinstruction judging circuit 1210 will transmit it directly to the logical address to physical address conversion circuit 736, and obtain the physical address used for the flash memory chip 105. The Flash controller 1221, 1222, 1223, based on the physical address, will read out the data from the flash memory chip 105 through the flash memory interfaces 1231, 1232, 1233. And based on the fields in the DMA microinstructions indicating the storage unit addresses in the corresponding buffer memory 106, it obtains the DMA host address from the buffer memory 106 corresponding to the DMA microinstruction, and initiates the DMA transmission through the DMA read interface 1212 between the host 101 and the storage device 102, transmitting the read data to the position indicated by the DMA host address in the host RAM 722 in the host 101. The flash memory interface 1231, 1232, 1233 are coupled to the DMA read interface via the multiplexer 1243, so that the data obtained from the flash memory interface 1231, 1232, 1233 can be transmitted to the host RAM 722 via the DMA read interface 1212. When the flash memory interfaces 1231, 1232, 1233 read out data from the flash memory chip 105, the completion control circuit 1242 accesses to the buffer memory 106 still based on the fields in the DMA microinstructions indicating the storage unit addresses in the corresponding buffer memory 106, and further obtains the length of the DMA data part, and decrease it progressively (e.g., minus 1 or minus unit length). Thus, when the length of the DMA data part becomes 0, it means that the DMA descriptor 600 operation is completed. Then, an interrupt can be sent to the host, to indicate the completion of the DMA descriptor operation.

In the storage devices disclosed in FIG. 12, multiple concurrent operation to the DMA descriptor 600 can be supported. For each of the multiple DMA descriptors 600, through the linked list created in the buffer memory 106, the DMA data corresponding to the same DMA descriptor 600 are associated together, so that the sequence of operations to the multiple DMA microinstructions becomes unimportant.

It has been described in details above the execution of data write operation by the storage device or the DMA descriptors related to the write operation. Obviously, the execution of the read operation by the storage device can also benefit from this invention. For example, the flash chip address and buffer memory address both can be specified in the read command, and use the buffer memory as the buffer for the readout data. It can also describe the buffer memory address in the DMA descriptor associated with the read operation. After the data is read from the flash memory chip, the buffer memory can be used as a cache for the readout data.

Figure 13:
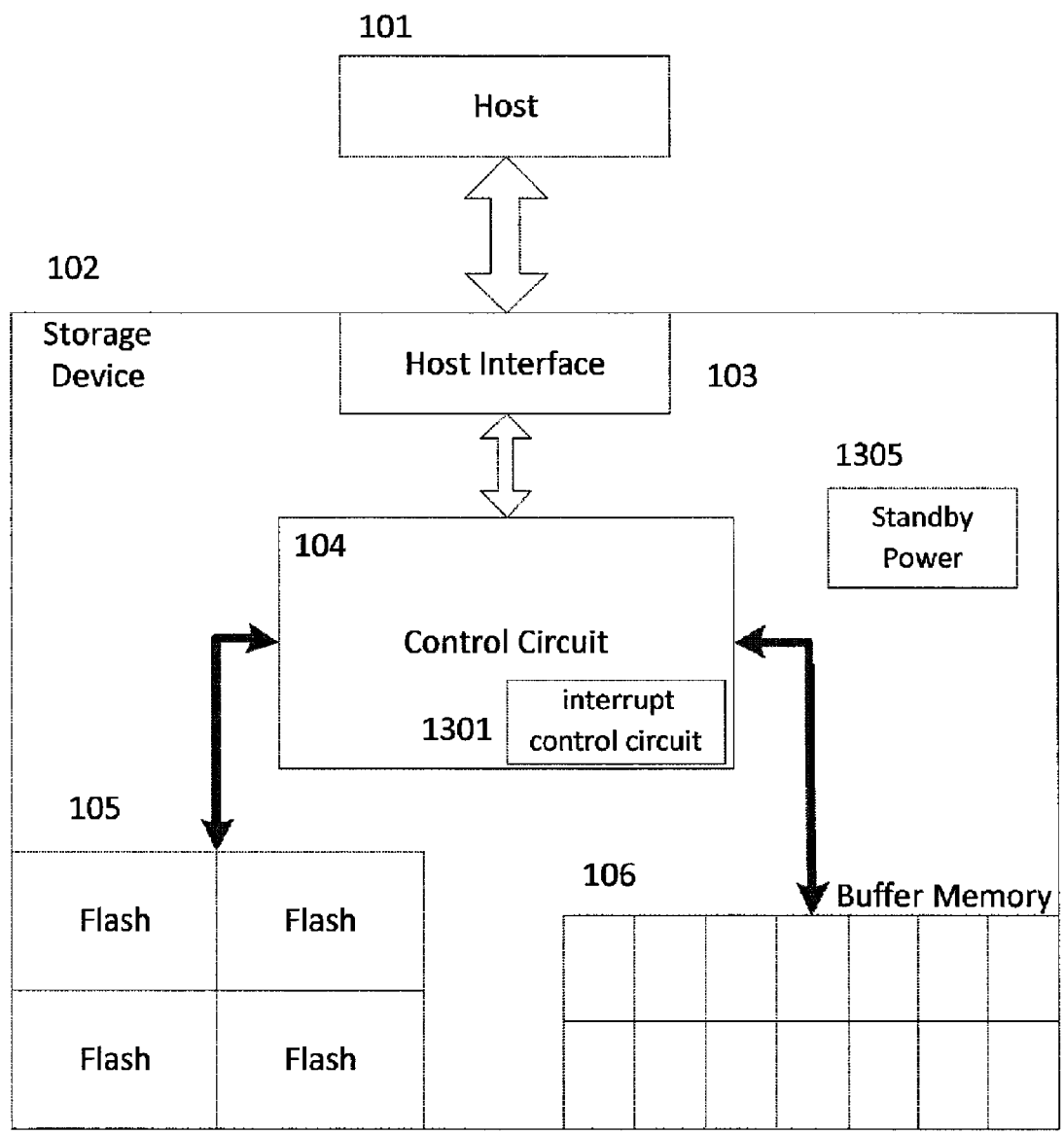
FIG. 13 is a structure block diagram of the storage device according to another embodiment of the invention.

FIG. 13 is a structure diagram of the storage device according to another embodiment of the invention. The storage device in FIG. 13 is similar to the one in FIG. 1. The difference is that the control circuit 104 also includes the interrupt control circuit 1301. In a further embodiment, the storage device also includes the standby power 1305. There can be many ways of providing the standby power 1305, for example, super capacitor, UPS, rechargeable batteries, etc. As already described above that the control circuit 104, based on the command 200 in FIG. 2A, writes the data from the host 101 to the buffer memory 106, and then to the flash memory chip 105. And after writing data to the buffer memory 106 based on the command 200, a message or interrupt request will be sent to the host 101, indicating that the write operation of the command 200 has been completed. Although at this moment the data has not yet been written to the flash memory chip 105, but the storage device 102 can ensure that the data will be reliably written to the flash memory chip 105. Even if the unexpected power outage happens, the standby power 1305 can also provide electric energy for writing the data in the buffer memory 106 to the flash memory chip 105.

As the capacity of the standby power 1305 may not be sufficient to support writing all the data in the buffer memory 106 to the flash memory chip 105, thus, the interrupt control circuit 1301 may also be monitoring the data amount in the buffer memory 106 that has not yet been written to the flash memory chip 105. When the data amount exceeds a predetermined threshold, and makes the energy of the standby power 1305 incapable to support writing the data amount to the flash memory chip 105, the interrupt control circuit 1301 will temporarily suppress the activities of sending messages or interrupts to the host 101. Since no messages or interrupts from the storage device 102 have been received, the host 101 will realize that the storage device 102 has not complete the execution of the write command 200, which means that if the power outage happens at this moment, the storage device 102 can not ensure the completion of the write command 200, and the data carried in the write command 200 may be lost.

When not receiving messages or interrupts indicating the completion of the write command 200 from the storage device 102, the host 101 may consider the storage device 102 as in state of "busy", and accordingly temporarily not send further write command to the storage device 102. The host 101 may also not wait for the message or interrupt indicating completion of the write command 200, and send other write commands concurrently or asynchronously to the storage device 102. But the host 101 should be aware that, the execution of the write command not receiving the message or interrupt indicating the completion may not be completed. It should also be noted that in the case of the host 101 allocating the buffer memory 106 of the storage device 102, the message or interrupt indicating the completion of the write command 200 may not mean the release of the corresponding storage unit of the buffer memory 106, because there has been data in the corresponding storage units of the buffer memory 102 not yet written to the flash memory chip 105, and these storage units are still being occupied.

Thus, it will detect the data amount to be written to the flash memory chip 105 in the buffer memory 106 by the interrupt control circuit 1301, and temporarily not send messages or interrupts to the host 101 indicating the completion of the write command 200, which ensures that the amount of the data to be written to the flash memory chip 105 in the buffer memory 106 will not exceed the capacity of the standby power 1305.

In one example, the interrupt control circuit 1301 maintains a counter. When the control circuit 104 writes data to the buffer memory 106, the counter will be incremented; when the control circuit 104 fetches the data in the buffer memory 106 and writes it to the flash memory chip 105, the counter will be decremented. Thus, when the value of the counter exceeds the predetermined threshold value, the interrupt control circuit 1301 will implement the interrupt suppression. With the control circuit 104 continually fetching data in the buffer memory 106 and writing it to the flash memory chip 105, which decrements the counter to a point below the predetermined threshold, the interrupt control circuit 1301 will restart sending messages or interrupts to the host 101 indicating the completion of the write command 200. There are many similar ways that can obtain the amount of data to be written to the flash memory chip 105 in the buffer memory 106, such as providing the buffering queue, and monitoring the depth of the queue. In one example, the control circuit 104 will record the data amount to be written to the buffer memory 106 and the data amount to be written to the flash chip 105, and interrupt control circuit 1301 will calculate the difference of the two amount to get the data amount cached in the buffer memory 106 which is to be written to the flash memory chip 105.

The predetermined threshold value can be set in advance. It is related to the electric quantity of the standby power 1305, the power consumption of the storage device 102 and other relevant factors. As to the specific standby power 1305 and storage device 102, the suitable predetermined threshold value can be determined by experiments. As well as considering for reliability, it is preferable in setting the threshold value to provide a certain margin. As the electric quantity of the capacitor and the battery will change with time, it can also measure the electric quantity of the standby power 1305 or indicate the parameters of the electric quantity at runtime, such as mentioned in the patent documents of U.S. Pat. No. 8,031,551 B2 United states. And the correspondence of the parameters with the threshold can be established and stored in the storage device 102, used for detecting the parameters of the standby power 1305 at runtime, and adjusting the threshold. The threshold can also be set to the storage device 102 by the host 101. The specific threshold setting command can be provided by the host 101, and received by the storage device 102. In the threshold setting command it can carry the threshold to be set, and based on the threshold setting command it can also cause the storage device 102 detecting the parameters of the standby power 1305 that indicate the electric quantity, and then change the threshold setting.

In one example, suppressing the activities of sending messages or interrupts to the host 101 by the interrupt control circuit 1301 is implemented by caching the messages or interrupts to be sent to the host 101. Specifically, the interrupt control circuit 1301 can cache the identifier for identifying the write command 200 to the host 101. Alternatively, the write command 200 itself can be cached. And the buffer memory address 204 indicated by the write command 200 can also be cached, because the buffer memory address 204 can indicate to the host 101 which storage unit or units shall be released. Moreover, the suppression of sending messages or interrupts by the interrupt control circuit 1301 does not depend on the buffer memory address 204 carried by the write command 200. In the situation when the buffer memory address is not carried in the write command and the buffer memory 106 is assigned by the storage device 102, it may also implement the suppression of the messages or interrupts. In this case, the write command itself or the identifier of the write command can be cached.

It needs to be pointed out that even if the interrupt control circuit 1301 suppresses the activities of sending messages or interrupts to the host 101, the control circuit 104 will still write the data in the buffer memory 106 to the flash memory chip 105.

In the event of the power down, the messages or interrupts cached by the interrupt control circuit 1301 will be discarded, and the corresponding data that has not yet been written to the flash memory chip 105 will also be discarded, and the data in the buffer memory 106 corresponding to the write command that has sent the messages or interrupts indicating the completion of the execution to the host 101 will be written to the flash memory chip 105.

It should also be noticed that when the buffer memory 106 is empty, the host 101 may send a plurality of write commands to the storage device 102, and soon receive the messages or interrupts indicating the completion of the write command. At this time, the host 101 will experience the nice write performance of the storage device 102. When the free space of the buffer memory 106 is exhausted, or because the interrupt control circuit 1301 implements the interrupt suppression, the host 101 will experience that the write performance of the storage device 102 gets worse rapidly. The fluctuation of the performance is adverse, because the time consumed by the writing process will become unpredictable.

In order to reduce the fluctuation, the interrupt control circuit 1301 will also monitor the number of times of sending messages or interrupts to the host 101 within a certain period of time. If within a certain period of time messages or interrupts have been sent too many times, such as more than a certain threshold, then the interrupt control circuit 1301 will suppress the activities of sending messages or interrupts to the host 101. Thus, when there is more free space in the buffer memory 106 in the storage device 102, although the storage device 102 can accept more concurrent write command, not too many messages or interrupts will be sent to the host through the interrupt suppression of the interrupt control circuit 1301. The time period of implementing the monitoring here can be set by the user, and can be adjusted dynamically at run time, and the corresponding threshold can also be set by the user, and can also be adjusted dynamically at run time.

It should also be pointed out that the message or interrupt suppression implemented for reducing the fluctuation and the message or interrupt suppression implemented for adapting with the electric quantity of the standby power can be implemented individually, or in combination. It has been described above the examples of the message or interrupt suppression implemented for reducing the fluctuation and the message or interrupt suppression implemented for adapting with the electric quantity of the standby power being implemented individually. In the example of being implemented in combination, the interrupt control circuit 1301 detects the data amount in the buffer memory 106 that has not yet been written to the flash memory chip 105. When the data amount exceeds a predetermined threshold, the interrupt control circuit 1301 will generate a first interrupt suppression signal. The interrupt control circuit 1301 also monitors the number of times messages or interrupts actually being sent to the host 101 within a certain period of time. If the number of times of the messages or interrupts that have been sent within a certain period of time exceeds the certain second threshold, the interrupt control circuit 1301 will generate a second interrupt suppression signal. If either of the first interrupt suppression signal or the second interrupt suppression signal is effective, the interrupt control circuit 1301 will implement the message or interrupt suppression. For example, the interrupt control circuit 1301 will temporarily not send messages or interrupts to the host 101 but cache them. Further, with the implementation of the interrupt suppression as well as the data in the buffer memory 106 being written to the flash memory chip 105, the data amount in the buffer memory 106 that has not yet been written to the flash memory chip 105 will be less than the first threshold, thus the first interrupt suppression signal will become invalid; while with the implementation of the interrupt suppression and the passage of time, the number of times of the messages or interrupts that have been sent within a certain period of time will be less than the second threshold, thus the second interrupt suppression signal will become invalid. When the first and the second interrupt suppression signals both become invalid, the interrupt control circuit 1301 may send the cached or new generated messages or interrupts to the host 101.

Figure 14A:
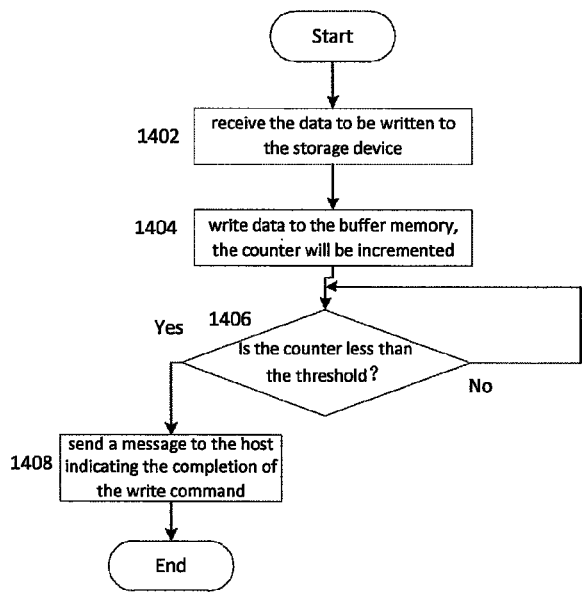
FIG. 14A is a flow chart of interrupt suppressions executed by the storage device according to another embodiment of the invention.
Figure 14B:
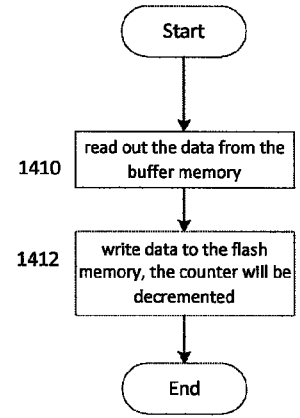
FIG. 14B is a flow chart of the interrupt suppressions executed by the storage device according to another embodiment of the invention.

FIGS. 14A and 14B are the flow charts of executing interrupt suppressions by the storage device according to another embodiment of the invention. Message or interrupt suppressions will be implemented to adapt with the electric quantity of the standby power. In Step 1402, the storage device 102 receives data to be written to the storage device from the host 101. In one example, the data is contained in the write command 200. In other examples, the data can be transmitted from the host 101 to the storage device 102 through the DMA mode. In Step 1404, the control circuit 104 writes the data to the buffer memory 106, and increments the counter. The counter value indicates the amount of data in the buffer memory 106 that has not yet been written to the flash memory chip 105. For the write command with a fixed amount of data, incrementing the counter can be increasing the number of units, such as 1. For the write command with a variable amount of data, incrementing the counter can be increasing the numerical value corresponding to the amount of data. As disclosed above, after writing data to the buffer memory 106, the interrupt control circuit 1301 may send a message or interrupt to the host 101, to indicate the completion of the write command And in order to implement the interrupt suppression, in Step 1406, the interrupt control circuit 1301 will determine whether the counter is less than the predetermined threshold. If the counter value is less than the predetermined threshold, then Step 1408 will be executed, in which the interrupt control circuit 1301 will send a message or interrupt to the host indicating that the write command has been completed. In Step 1406, if the interrupt control circuit 1301 finds that the counter is greater than the predetermined threshold, it will not send the message or interrupt indicating the completion of the write command to the host 101. The interrupt control circuit 1301 may implement the messages or interrupt suppressions by caching them.

Continue to see FIG. 14B, which shows the flow chart of the other part of the method concurrent with the one shown in FIG. 14A. When there are data in the buffer memory 106 that has not yet been written to the flash memory chip 105, the control circuit 104 will read out the data from the buffer memory 106, as in Step 1410. And, in Step 1412, the control circuit 104 will also write the read out data to the flash memory chip 105, and will decrement the counter. The decrement of the counter can be the amount of units or the numerical value corresponding to the amount of data. Step 1410 and 1412 are executed in parallel with Steps 1402, 1404, 1406, 1408. Therefore, in Step 1406, if the interrupt control circuit 1301 finds that the counter is greater than the predetermined threshold, the interrupt controller 1301 and implements the interrupt suppression, with the execution of Steps 1410 and 1412, the buffered data will be constantly written to the flash memory chip 105. Thus the counter value will be decremented, and it may become less than the predetermined threshold.

Figure 15:
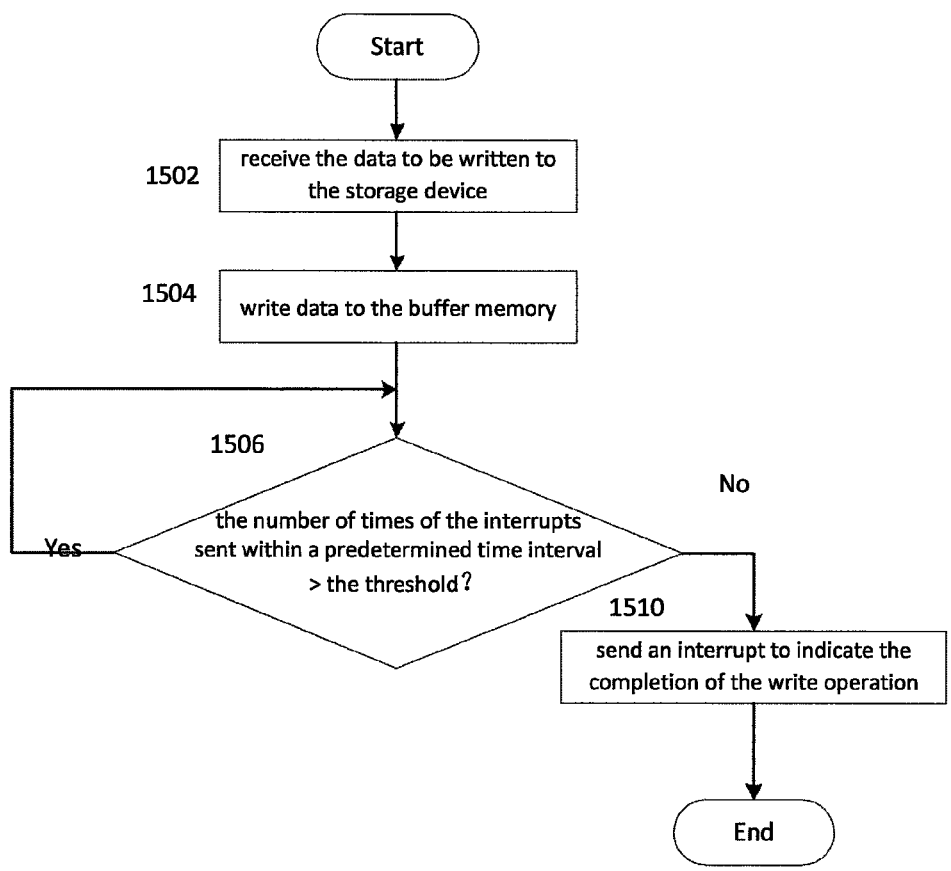
FIG. 15 is a flow chart of the interrupt suppressions executed by the storage device according to another embodiment of the invention.

FIG. 15 is a flow chart of the storage device 102 executing interrupt suppressions according to another embodiment of the invention. In order to reduce the fluctuation the message or interrupt suppression is implemented. In Step 1502, the storage device 102 will receive the data to be written to the storage device from the host 101. In one example, the data is contained in the write command 200. In other examples, the data can be transmitted from the host 101 to the storage device 102 through the DMA mode. In Step 1504, the control circuit 104 writes the data to the buffer memory 106, and increments the counter. The counter indicates the amount of data in the buffer memory 106 that has not yet been written to the flash memory chip 105. As already disclosed above, after writing data to the buffer memory 106, the interrupt control circuit 1301 may send a message or interrupt to the host 101, to indicate the completion of the write command, and count the number of times of the messages or interrupts that have been sent. And in order to implement the interrupt suppression, in Step 1506, the interrupt control circuit 1301 will determine whether the number of interrupts within a predetermined time interval is greater than the predetermined threshold. In one example, a timer which generates a time signal at regular intervals can be used. And the number of times of the messages or interrupts occurring between the two time signals will be monitored. If the number of times of the interrupts is not greater than the predetermined threshold, Step 1510 will be executed, in which the interrupt control circuit 1301 will send a message or interrupt to the host indicating the completion of the write command. In Step 1506, if the interrupt control circuit 1301 finds that the counter is greater than the predetermined threshold, it will not send the message or interrupt indicating the completion of the write command to the host 101. The interrupt control circuit 1301 may implement the message or interrupt suppression by caching the message or interrupt. In another example, when the time signal of the timer is effective, a predetermined numerical value will be set for the counter, which shows the number of messages or interrupts that can be sent to the host 101 before the next effective time signal of the timer. And once sending a message or interrupt, the counter will be decremented. If the counter is decremented to 0 before the next effective time signal of the timer, the interrupt controller 1301 will begin to implement the interrupt suppression. In one example, the timer interval and/or predetermined threshold can be updated by the host 101 or the control circuit 104. It should also be pointed out that the message or interrupt suppression implemented by the interrupt controller 1301 will not affect the control circuit 104 writing data in the buffer memory 106 to the flash memory chip 105. When there is data to be written in the buffer memory 106, the control circuit 104 may write data in the buffer memory 106 to the flash memory chip 105 in parallel with other operations.

In a further embodiment, the message or interrupt suppression implemented for adapting with the standby power shown in FIG. 14A, 14B, and the message or interrupt suppression implemented for reducing the fluctuation shown in FIG. 15 can be combined together. The control circuit 104 receives the data to be written to the storage device 102, and writes it to the buffer memory 106. The interrupt control circuit 1301 will detect the amount of data in the buffer memory 106 that has not yet been written to the flash memory chip 105. When the amount of data exceeds the first predetermined threshold, the interrupt control circuit 1301 will generate a first interrupt suppression signal. The interrupt control circuit 1301 also monitors the number of times messages or interrupts actually being sent to the host 101 within a certain time period. If the number of times of the messages or interrupts that have been sent within a certain period of time exceeds the certain second threshold, the interrupt control circuit 1301 will generate a second interrupt suppression signal. If either of the first interrupt suppression signal or the second interrupt suppression signal is effective, the interrupt control circuit 1301 will implement the message or interrupt suppression. For example, the interrupt control circuit 1301 will temporarily not send messages or interrupts to the host 101 but cache them. Further, with the implementation of the interrupt suppression as well as the data in the buffer memory 106 being written to the flash memory chip 105, the data amount in the buffer memory 106 that has not yet been written to the flash memory chip 105 will be less than the first threshold, thus the first interrupt suppression signal will become invalid; while with the implementation of the interrupt suppression and the passage of time, the number of times of the messages or interrupts that have been sent within a certain period of time will be less than the second threshold, thus the second interrupt suppression signal will become invalid. When the first and the second interrupt suppression signals both become invalid, the interrupt control circuit 1301 may send the cached or new generated messages or interrupts to the host 101.

Figure 16A:
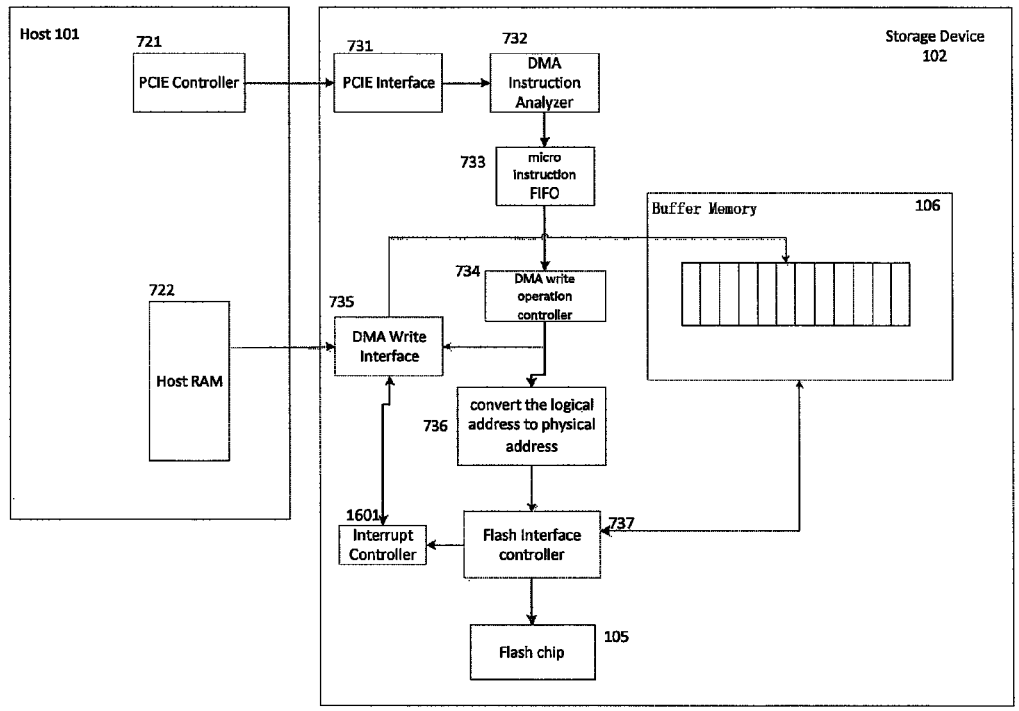
FIG. 16A is a structure diagram of the storage device executing interrupt suppressions according to another embodiment of the invention.

FIG. 16A is a structure diagram of the storage device executing interrupt suppressions according to another embodiment of the invention. The storage device in FIG. 16A is similar with the one in FIG. 7C, which is used for showing the DMA descriptor 600 according to FIG. 6. The difference is that it also includes the interrupt controller 1601. The interrupt controller 1601 is coupled to the DMA write interface 735 and the Flash interface controller 737. As mentioned above, for the first DMA micro instruction, the DMA write operation controller 734, using the DMA host address 621 and the buffer memory address 622, will initiate the DMA write operation between the host 101 and the storage device 102 through DMA interface 735, to transmit the data stored in the DMA host address 621, to the position indicated by the buffer memory address 622, in which the transmitted data can have a predetermined length (for example 4K bytes). Next, the interrupt controller 1601 will record the amount of data in the buffer memory 106 that has not yet been written to the flash memory chip 105. For each DMA micro instructions is corresponding to the same amount of data (for example 4K bytes), the counter can be maintained by the interrupt controller 1601, which will increment the counter by a unit value (such as 1, corresponding to the 4K byte) when (or after) writing data to the buffer memory 106 according to the first DMA micro instruction. For the second DMA micro instruction, the DMA write operation controller 734 will execute a similar operation, to transmit the data stored in the DMA host address 631 data to the position indicated by the buffer memory address 632. When (or after) writing data to the buffer memory 106 according to the first DMA micro instruction, it will still increment the counter by a unit value. As already disclosed above, for each DMA micro instruction, the Flash interface controller 737 will write the data in the buffer memory 106 to the flash memory chip 105 based on the physical address provided by the logical address to physical address conversion circuit 736. Then, the interrupt controller 1601 will decrement the counter by a unit value.

After writing data to the buffer memory 106 in DMA mode based on the first DMA micro instruction or the second DMA micro instruction, the interrupt controller 1601 will check whether the counter is greater than the predetermined threshold. If the counter is greater than the predetermined threshold, it means that the buffer memory 106 has already stored too much data to be written. In the case of unexpected power outage, the electric quantity of the standby power on the storage device 102 is not sufficient to support saving the data to be written to the flash memory chip 105. Therefore, the interrupt controller 1601 will suppress the message or interrupt sent to the host 101 indicating the completion of the first DMA micro instruction or the second DMA micro instruction. In one example, when the first DMA micro instruction and the second DMA micro instruction included in the DMA descriptor 600 are completed, which means the data transmitted based on the first DMA micro instruction and the second DMA micro instruction is written to the buffer memory 106, or the flash controller will determine to send the message or interrupt indicating the completion of the DMA in descriptor 600 based on whether the counter is greater than the predetermined threshold. When the unexpected power outage actually occurs, messages or interrupts suppressed by the interrupt controller 1601, and the corresponding DMA micro instruction or the DMA descriptor will be discarded. And the data, which is indicated the transmission by the DMA micro instruction or DMA descriptor corresponding to the message or interrupt sent by the interrupt controller 1601 to the host 101, will be written to the flash memory chip 105 using the standby power.

In another embodiment, the interrupt controller 1601 also use another counter to record the number of times of the messages and interrupts actually sent to the host 101 within a predetermined time interval. The predetermined time interval can be obtained by setting a timer. If within the predetermined time interval, the number of the messages and interrupts actually sent to the host 101 exceeds another threshold, the interrupt controller 1601 will suppress sending messages or interrupts to the host 101.

Still in another embodiment, the message or interrupt suppression implemented for adapting with the standby power, and the message or interrupt suppression implemented for reducing the fluctuation can be combined together. When the interrupt control circuit 1301 detects that the data amount in the buffer memory 106 not yet written to the flash memory chip 105 exceeds a predetermined threshold, it will generate a first interrupt suppression signal. When the interrupt controller 1601 detects that the number of the messages and interrupts actually sent to the host 101 within the predetermined time interval exceeds another threshold, it will generate a second interrupt suppression signal. When either of the first interrupt suppression signal or the second interrupt suppression signal is effective, the interrupt control circuit 1301 will implement the message or interrupt suppression. With the Flash interface controller 737 writing data in the buffer memory 106 to the flash memory chip 105, the first interrupt suppression signal may become invalid, and with the passage of time and the timer sending a time signal, the second interrupt suppression signal may become invalid. When the first and the second interrupt suppression signals both become invalid, the interrupt control circuit 1301 may stop implementing the interrupt suppression and send the cached messages or interrupts to the host 101.

The time period of the timer here can be set by the user, and can be adjusted dynamically at run time, and the corresponding threshold (including the threshold associated with the amount of data in the buffer memory 106 to be written to the flash memory chip 105, and the threshold associated with the number of messages or interrupts actually sent to the host 101 within a predetermined time interval) can also be set by the user, and can also be adjusted dynamically at run time.

Figure 16B:
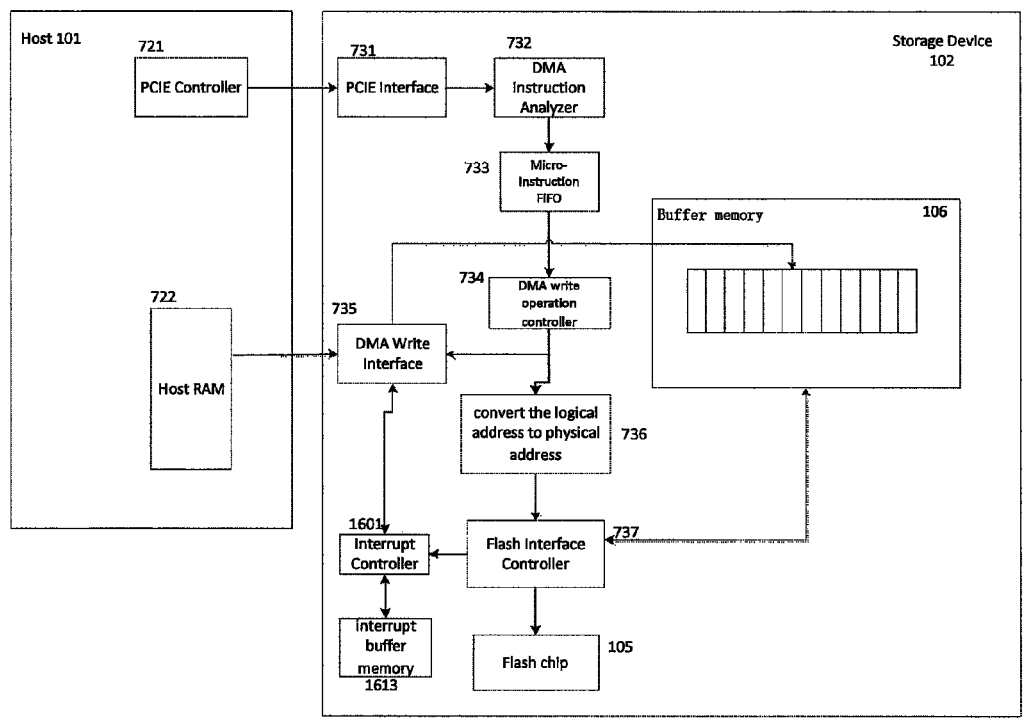
FIG. 16B is a structure diagram of the storage device executing interrupt suppressions according to another embodiment of the invention.

FIG. 16B is a structure diagram of the storage device executing interrupt suppressions according to another embodiment of the invention. The storage device in FIG. 16B is similar to the one in FIG. 16A, which is used for implementing the DMA descriptor shown in FIG. 6. The difference is that it also includes the interrupt control circuit 1301. The interrupt buffer memory 1613 is coupled to the interrupt controller 1601. When the interrupt controller 1601 determines to implement a message or interrupt suppression, it will cache the message or interrupt in the interrupt buffer memory 1613. In one example, the interrupt controller caches all the messages or interrupts to be sent to the host 101 in the interrupt buffer memory 1613. And, in situations in which there's no need to implement the interrupt control, it will fetch the messages or interrupts from the buffer memory 1613, and send them to the host 101. In one example, the identifier cached in the interrupt buffer memory 1613 is used for identifying the DMA descriptor 600 to the host 101. Alternatively, the first DMA micro instruction and the second DMA micro instruction can be cached. And the buffer memory address 622 and the buffer memory address 632 can also be cached, as the buffer memory address 622, 632 may indicate the DMA descriptor 600 to the host 101. In a preferred embodiment, one of the buffer memory address 622 and the buffer memory address 632 will be cached in the interrupt buffer memory. By indicating one of the buffer memory address 622, 632 in the message or interrupt to the host 101, referring to the embodiments disclosed in FIG. 9A and FIG. 9B, the host 101 can get a corresponding IO request list, and thus learn which IO request is completed.

In another embodiment, the interrupt buffer memory 1613 may not be set, and as an alternative the messages or interrupts to be sent to the host 101 will be cached in the buffer memory 106.

Figure 16C:
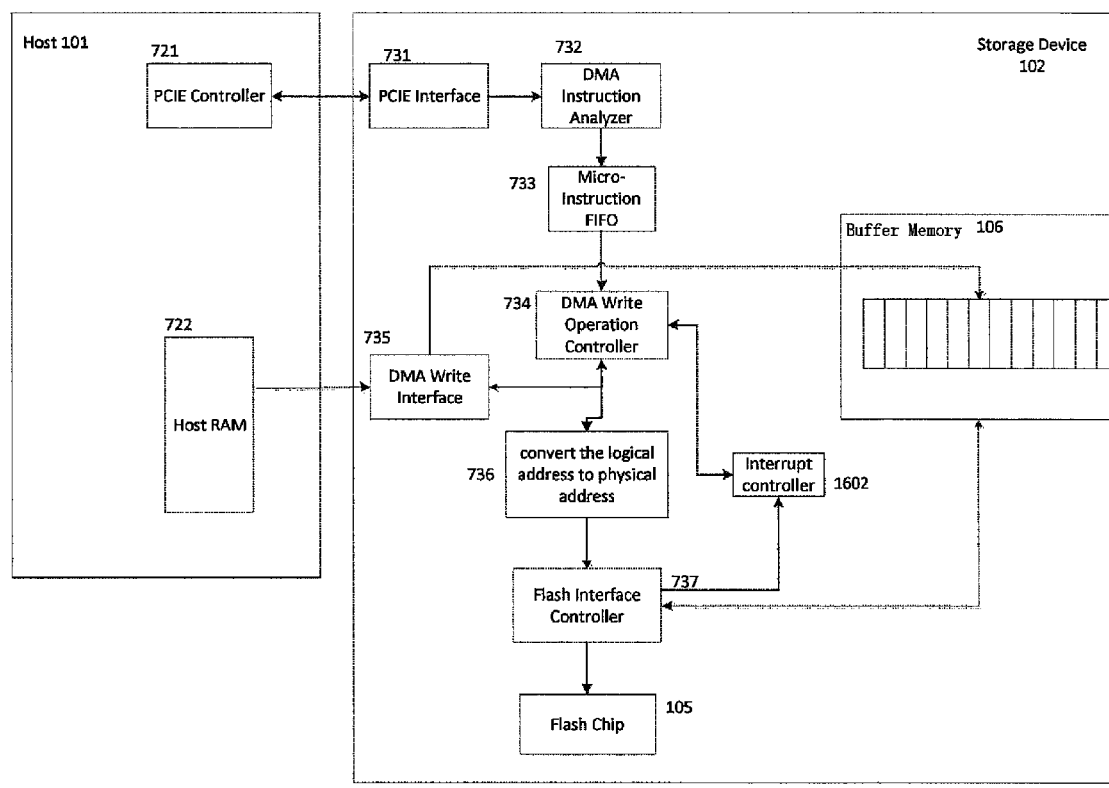
FIG. 16C is a structure diagram of the storage device executing interrupt suppressions according to another embodiment of the invention.

FIG. 16C is a structure diagram of the storage device executing interrupt suppressions according to another embodiment of the invention. The storage device in FIG. 16C is similar to the one in FIG. 16A, which is used for implementing the DMA descriptor shown in FIG. 6. The difference is that, the interrupt controller 1602 is not coupled to the DMA write interface 735 but to the DMA write operation controller 734 and the Flash interface controller 737. As mentioned above, for the first DMA micro instruction, the DMA write operation controller 734, using the DMA host address 621 and the buffer memory address 622, will initiate the DMA write operation between the host 101 and the storage device 102 through DMA interface 735, to transmit the data stored in the DMA host address 621, to the position indicated by the buffer memory address 622, in which the transmitted data can have a predetermined length (for example 4K bytes). Next, the interrupt controller 1601 will record the amount of data in the buffer memory 106 that has not yet been written to the flash memory chip 105. For each DMA micro instructions is corresponding to the same amount of data (for example 4K bytes), the counter can be maintained by the interrupt controller 1601, which will increment the counter by a unit value (such as 1, corresponding to the 4K byte) when (or after) writing data to the buffer memory 106 according to the first DMA micro instruction. For the second DMA micro instruction, the DMA write operation controller 734 will execute a similar operation, to transmit the data stored in the DMA host address 631 data to the position indicated by the buffer memory address 632. When (or after) writing data to the buffer memory 106 according to the first DMA micro instruction, it will still increment the counter by a unit value. As already disclosed above, for each DMA micro instruction, the Flash interface controller 737 will write the data in the buffer memory 106 to the flash memory chip 105 based on the physical address provided by the logical address to physical address conversion circuit 736. Then, the interrupt controller 1601 will decrement the counter by a unit value.

When the interrupt controller 1602 determines to implement a message or interrupt suppression, the interrupt controller 1602 will indicate that the DMA write operation controller 734 should suspend the operation of obtaining the DMA micro instructions from the micro instruction FIFO733. In this way, the DMA micro instructions that have not been executed will be cached in FIFO733. While corresponding to the DMA micro instructions that have been executed through the DMA write operation controller 734 and DMA write interface 735, the interrupt controller 1602 will send messages or interrupts to the host 101 indicating the completion of these DMA micro instructions. Or, in one example, when all the DMA micro instructions corresponding to a DMA descriptor have been executed through the DMA write operation controller 734 and DMA write interface 735, the interrupt controller 1602 will send messages or interrupts to the host 101 indicating the completion of these DMA micro instructions or the DMA descriptor. When the interrupt controller 1602 determines that there's no need to implement the interrupt suppression along with the data in the buffer memory 106 being written to the flash memory chip 105, it will indicate that the DMA write operation controller should obtain the DMA micro instructions from the micro instruction FIFO733 and execute them.

When the power outage actually occurs, the micro instructions in the micro instruction FIFO733 are discarded, and the data, which is indicated the transmission by the DMA micro instruction or DMA descriptor corresponding to the message or interrupt sent by the interrupt controller 1602 to the host 101, will be written to the flash memory chip 105 using the standby power.

In another embodiment, the interrupt controller 1602 also maintains the timer to monitor the number of the messages or interrupts sent to the host 101 within a certain period of time. When the number of the messages and interrupts sent to the host 101 exceeds the threshold within the predetermined time interval, the interrupt controller 1602 will suppress the activity of sending messages or interrupts to the host 101, namely, indicating that the DMA write operation controller 734 should suspend the operation of obtaining the DMA micro instructions from the micro instruction FIFO733.

Still in another embodiment, in the interrupt controller 1602, the message or interrupt suppression implemented for adapting with the standby power, and the message or interrupt suppression implemented for reducing the fluctuation will be combined together.

Figure 16D:
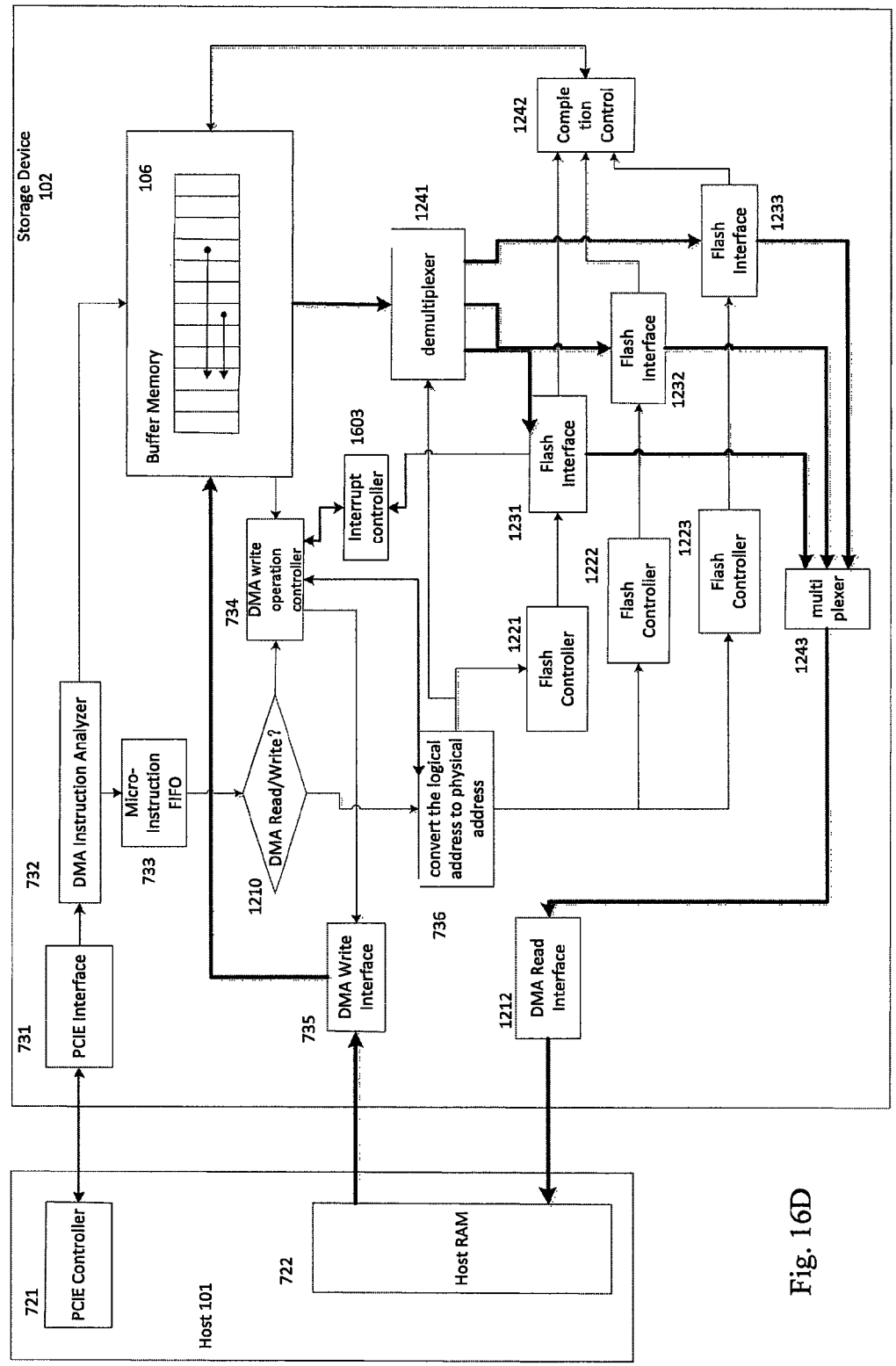
FIG. 16D is a structure diagram of the storage device executing interrupt suppressions according to another embodiment of the invention.
Figure 17:
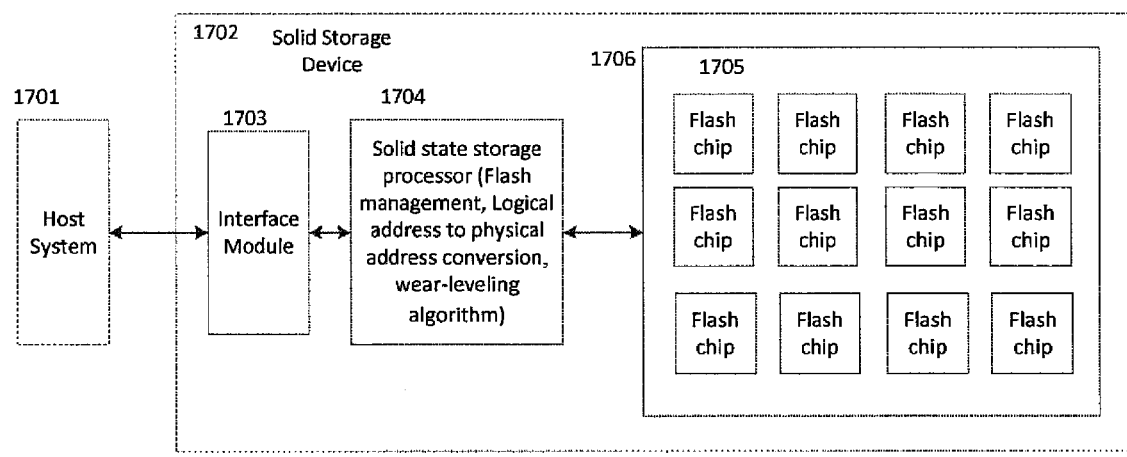
FIG. 17 is a structure diagram of the solid state storage device in the prior art.

FIG. 16D is a structure diagram of the storage device executing interrupt suppression according to another embodiment of the invention. The storage device in FIG. 16D is similar to the one in FIG. 12, which is used for implementing the DMA descriptor shown in FIG. 6. The difference is that it also includes the interrupt controller 1603. The interrupt controller 1603 is coupled to the DMA write operation controller 734 and the Flash interface 1231, the Flash interface 1232 (not shown), and the Flash interface 1233 (not shown). The interrupt controller 1603 will set the first counter for the flash memory chip coupled with the Flash interface 1231, and set the second counter for the flash memory chip coupled with the Flash interface 1232, and set the third counter for the flash memory chip coupled with the Flash interface 1233. In situations that the Flash interface 1231, 1232, 1233 are each respectively coupled with multiple flash memory chips or flash memory dies, it can set corresponding counters respectively for the flash memory chips or flash memory dies coupled with each of the Flash interface 1231, 1232, 1233. When implementing the message or interrupt suppression for adapting with the standby power, it will respectively monitor the amount of data to be written preferably in the multiple flash memory chips or flash memory dies coupled with the Flash interface 1231, 1232, 1233.

As an example, in one embodiment, each of the Flash interfaces 1231, 1232, 1233 is coupled with a flash memory chip, and each flash memory chip contains a flash memory die. The first counter, the second counter and the third counter each corresponds to the flash memory chip or die coupled with the Flash interface 1231, the flash memory chip or die coupled with the Flash interface 1232, and the flash memory chip or die coupled with the Flash interface 1233. For the situation that each of the Flash interface 1231, 1232, 1233 is coupled to multiple flash memory chips or dies, it can be implemented in a similar way. When it's under control of the DMA write controller 734, it will implement the DMA micro instructions, and initiate the DMA write operation between the host 101 and the storage device 102 through DMA interface 735. After writing the data in the DMA mode to buffer memory 106, the interrupt controller 1603 will obtain the logical address corresponding to the DMA micro instruction used for the flash memory chip 105 through the DMA write operation controller 734, and then obtain the physical address used for the flash memory chip 105 corresponding to this logical address, to determine the flash memory chip or die to which the DMA micro instruction data should be written, and increment the counter set for this flash memory chip or die (for example, the second counter). The interrupt controller 1603 may also use other ways to obtain the physical address corresponding to the DMA micro instruction used for the flash memory chip 105. When one of the Flash interface 1231, 1232, 1233 (for example, the Flash interface 1232) is writing data to the coupled flash memory chip 105, it will indicate the interrupt counter controller 1603 that the counter corresponding to the flash memory chip or die to which the data is being written (in this example, the second counter) should be decremented.

When any one of the first counter, the second counter and the third counter exceeds the predetermined threshold, the interrupt controller 1603 will implement the interrupt suppression. When none of the first counter, second and third counters exceeds the predetermined threshold value, the interrupt controller 1603 will relieve the interrupt suppression. It should also be realized that the predetermined threshold corresponding to the first counter, the second counter and the third counter can be different from each other, to adapt with its corresponding flash memory chip or die.

In another embodiment, the interrupt controller 1603 also maintains the timer to monitor the number of the messages or interrupts sent to the host 101 within a certain period of time. When the number of the messages and interrupts sent to the host 101 exceeds the threshold within the predetermined time interval, the interrupt controller 1603 will suppress the activity of sending messages or interrupts to the host 101, namely, indicating that the DMA write operation controller 734 should suspend the operation of obtaining the DMA micro instructions from the micro instruction FIFO733.

Still in another embodiment, in the interrupt controller 1603, the message or interrupt suppression implemented for adapting with the standby power, and the message or interrupt suppression implemented for reducing the fluctuation will be combined together.

As already been mentioned, the storage device 102 can support the concurrent operation to the multiple DMA descriptor 600. For each of the multiple DMA descriptor

600, it will be associated with a DMA data corresponding to a DMA descriptor 600 through the chain table created in the buffer memory 106, which makes the operation order of the multiple DMA micro instructions become less important. Messages or interrupts sent to the host 101 in the interrupt controller 1603 may indicate the completion of the DMA micro instruction, and may also indicate the completion of the DMA descriptor associated with the DMA micro instruction.

It has shown the description of the present invention for the purpose of describing and presenting, but not limiting the invention to the disclosed form. Many adjustments and changes are obvious to people belonging to the technical field.

What is claimed is:

1. A method of controlling interrupts in a storage device, wherein the storage device including a first flash memory, a second flash memory, and a buffer memory, the method comprising:
   receiving data to be written to the storage device from an information processing device;
   writing the received data to be written to the storage device to the buffer memory;
   fetching the data in the buffer memory and writing the data to the first flash memory or the second flash memory;
   sending a message to the information processing device, to indicate completion of the write request;
   wherein, after writing the received data to be written to the storage device to the buffer memory,
      if an amount of data in the buffer memory to be written to the first flash memory is less than a first predetermined threshold, and an amount of data in the buffer memory to be written to the second flash memory is less than a second predetermined threshold, and the number of times of sending messages, indicating completion of the write request, to the information processing device within a predetermined time interval is greater than or equal to a third predetermined threshold, then sending a message indicating completion of the write operation to the information processing device,
      if the amount of data in the buffer memory to be written to the first flash memory is greater than or equal to the first predetermined threshold, or the amount of data in the buffer memory to be written to the second flash memory is greater than or equal to the second predetermined threshold, or the number of times of sending messages, indicating completion of the write request, to the information processing device within the predetermined time interval is greater than or equal to the third predetermined threshold, then catching and not sending the message indicating the completion of the write operation to the information processing device while still receiving data to be written to the storage device from the information processing device and writing data from the buffer memory into the first flash memory and the second flash memory;
   wherein the first predetermined threshold and the second predetermined threshold are respectively corresponding to the amount of data that can be reliably fetched from the buffer memory and written to the first and second flash memory using a standby power.

2. The method of claim 1, further includes, using the information processing device, accessing or setting the first predetermined threshold and the second predetermined threshold, or measuring the electrical characteristics of the standby power, and modifying the first predetermined threshold and the second predetermined threshold based on the measurement results.

3. The method of claim 1, wherein the write request will be cached after being received from the information processing device.

4. A storage device includes a flash memory, a buffer memory, an information processing device interface and a control circuit, wherein the control circuit includes an interrupt controller, and the storage device is configured to communicably connect with an information processing device, wherein:
   the information processing device interface is configured to receive a write request from the information processing device;
   the control circuit, based on the write request, is configured to write data into the buffer memory;
   the control circuit is configured to fetch the data in the buffer memory and to write the data to the flash memory;
   the interrupt controller sends a message to the information processing device, to indicate completion of the write request;
   wherein after writing the received data to be written to the storage device to the buffer memory,
      if an amount of data in the buffer memory to be written to the first flash memory is less than a first predetermined threshold, and an amount of data in the buffer memory to be written to the second flash memory is less than a second predetermined threshold, and the number of times of sending messages, indicating completion of the write request, to the information processing device within a predetermined time interval is greater than or equal to a third predetermined threshold, then the interrupt controller sends a message indicating completion of the write operation to the information processing device;
      if the amount of data in the buffer memory to be written to the first flash memory is greater than or equal to the first predetermined threshold, or the amount of data in the buffer memory to be written to the second flash memory is greater than or equal to the second predetermined threshold, or the number of times of sending messages, indicating completion of the write request, to the information processing device within the predetermined time interval is greater than or equal to the third predetermined threshold, then the interrupt controller caches and does not send the message indicating the completion of the write operation to the information processing device while the information processing device interface still receives data to be written to the storage device from the information processing device and writes data from the buffer memory into the first flash memory and the second flash memory;
   wherein the first predetermined threshold and the second predetermined threshold are respectively corresponding to the amount of data that can be reliably fetched from the buffer memory and written to the first and second flash memory using a standby power.

5. The storage device of claim 4, wherein the write request is cached by the control circuit after receiving the write request from the information processing device by the information processing device interface.

6. The storage device of claim 4, wherein, the control circuit also accesses or sets the first predetermined threshold and the second predetermined threshold based on a command from the information processing device, or the control circuit measures the electrical characteristics of the standby power, and modifies the first predetermined threshold and the second predetermined threshold based on the measurement results.

* * * * *